(12) United States Patent  
Matsushita et al.

(10) Patent No.: US 8,410,375 B2
(45) Date of Patent: Apr. 2, 2013

(54) WIRING BOARD AND METHOD OF MANUFACTURING THE SAME

(75) Inventors: Yoshitaka Matsushita, Nagano (JP); Kazuhiro Oshima, Nagano (JP); Akio Horiuchi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 741 days.

(21) Appl. No.: 12/245,025

(22) Filed: Oct. 3, 2008

(65) Prior Publication Data
US 2009/0095518 A1 Apr. 16, 2009

(30) Foreign Application Priority Data

Oct. 5, 2007 (JP) ................. 2007-261850

(51) Int. Cl.
*H05K 1/16* (2006.01)
*H05K 1/11* (2006.01)
*H05K 1/00* (2006.01)
*H05K 1/14* (2006.01)

(52) U.S. Cl. ........ 174/261; 174/260; 174/263; 174/265; 174/266; 174/268; 361/736; 361/743; 361/791; 361/795

(58) Field of Classification Search .......... 174/250–268; 361/736–812
See application file for complete search history.

(56) References Cited

U.S. PATENT DOCUMENTS

| 2005/0039948 A1* | 2/2005 | Asai et al. ............. 174/262 |
| 2006/0243478 A1* | 11/2006 | Inagaki et al. ............. 174/255 |
| 2009/0255719 A1* | 10/2009 | Yamamoto et al. .......... 174/260 |

FOREIGN PATENT DOCUMENTS

| JP | 11-261228 | 9/1999 |
| JP | A-2000-058736 | 2/2000 |
| JP | 2000-243867 | 9/2000 |
| JP | 2000-323613 | 11/2000 |

OTHER PUBLICATIONS

Office Action from corresponding Japanese Patent Application No. JP-OA 2007-261850 dated Aug. 7, 2012 and its English translation thereof (6 pages).

* cited by examiner

*Primary Examiner* — Zachary M Pape
*Assistant Examiner* — Jerry Wu
(74) *Attorney, Agent, or Firm* — Drinker Biddle & Reath LLP

(57) ABSTRACT

A wiring board has a wiring member, a first reinforcing member and a second reinforcing member. The wiring member has wiring layers and insulating layers which are stacked, and the wiring layers include a first connecting electrode formed on a surface of the wiring member and a second connecting electrode formed on a back surface of the wiring member. A pin is formed on the second connecting electrode. The second reinforcing member is formed by a resin and serves to reinforce the wiring member. The first reinforcing member is formed on the whole back surface of the wiring member except for the pin provided on the second connecting electrode.

12 Claims, 27 Drawing Sheets

WIRING BOARD AND METHOD OF MANUFACTURING THE SAME

TECHNICAL FIELD

The present disclosure relates to a wiring board and a method of manufacturing the wiring board. More specifically, the present disclosure relates to a wiring board in which a reinforcing member is provided on a wiring member formed by stacking a wiring layer and an insulating layer on a support and then removing the support, and a method of manufacturing the wiring board.

RELATED ART

In a wiring board to be used in a semiconductor package, there has been used a build-up wiring board having a wiring board and an insulating layer, which are stacked on both upper and lower surfaces of a core board in order to increase a density of a wiring pattern.

However, an increase in a density of a semiconductor chip to be provided has progressed. For a build-up wiring board, there has been given a request for a further increase in a density of a wiring pattern and a further reduction in a thickness of a wiring board. In order to meet the request, there has been developed a build-up wiring board (a coreless board) described in Patent Document 1.

In the coreless board, predetermined numbers of wiring layers and insulating layers are stacked on a support and the support is then removed. Differently from a related-art build-up wiring board, therefore, the core board is not present and a reduction in a thickness of the wiring board can be achieved. Moreover, the wiring layer is formed on a flat support. Therefore, manufacturing precision can be enhanced and an increase in the density of the wiring pattern can also be achieved.

FIG. 1A shows an example of a wiring board manufactured by the manufacturing method (which is used as a semiconductor package). A wiring board 100 shown in FIG. 1A has a structure in which a wiring layer 102 and an insulating layer 103 are stacked to form a wiring member 101, and an upper electrode pad 107 is formed on an upper part of the wiring member 101 and a lower electrode pad 108 is formed on a lower part of the wiring member 101. Moreover, a solder bump 110 is formed on the upper electrode pad 107, and the lower electrode pad 108 is exposed from a solder resist 109 formed on a lower surface of the wiring member 101.

In the wiring board 100 in which the support is perfectly removed, the core board is not present. Therefore, the request for a reduction in a thickness can be achieved. However, the wiring board itself has a small mechanical strength. Accordingly, there is a problem in that the wiring board 100 is deformed readily in the case in which an external force is applied as shown in FIG. 1B. In a general wiring board using a glass epoxy resin, it has been proposed to form, on a wiring board, a frame-shaped reinforcing member constituted by a sealing resin and to thereby increase a mechanical strength of the wiring board. More specifically, the frame-shaped reinforcing member is formed along the periphery of the wiring board at a side in which an electronic element such as a semiconductor chip is mounted (Patent Document 2).

[Patent Document 1] Japanese Patent Unexamined Application Publication No. 2000-323613 Publication

[Patent Document 2] Japanese Patent Unexamined Application Publication No. 2000-243867 Publication The method of forming the reinforcing member by the resin as described above is effective because the reinforcing member can be formed easily and inexpensively by a mold using a metal mold. In a related-art frame-shaped reinforcing member, a mechanical strength in a portion in which the reinforcing member is provided is enhanced. However, there is a problem in that the deformation is still generated over the wiring board in the case in which an external force is applied in an opening formed in a central part.

SUMMARY

Exemplary embodiments of the present invention provide a wiring board which uses a resin as a reinforcing member and can reliably prevent a deformation of a substrate and a method of manufacturing the wiring board.

According to a first aspect of the invention, a wiring board comprises:

a wiring member having wiring layers and insulating layers, the wiring layers including a first connecting electrode formed on a first surface of the wiring member and a second connecting electrode formed on a second surface of the wiring member;

an external connecting terminal formed on the second connecting electrode; and a first reinforcing member being formed by a resin and formed on the whole second surface of the wiring member except for the second connecting electrode including the external connecting terminal.

According to another aspect of the invention, furthermore, a wiring board comprises:

a wiring member having wiring layers and insulating layers, the wiring layers including a first connecting electrode formed on a first surface of the wiring member and a second connecting electrode formed on a second surface of the wiring member;

an external connecting terminal formed on the second connecting electrode; and a first reinforcing member being formed by a resin and formed on the whole second surface of the wiring member including a bonding position of the external connecting terminal and the second connecting electrode except for the external connecting terminal.

In the invention, moreover, it is also possible to employ a structure in which an electronic component is provided on the second surface and is sealed with the first reinforcing member.

In the invention, furthermore, it is also possible to employ a structure in which a second reinforcing member constituted by a resin is formed on the first surface except for the first connecting electrode.

According to a further aspect of the invention, a method of manufacturing a wiring board comprises steps of:

forming a wiring member having wiring layers and insulating layers, the wiring layers including a first connecting electrode formed on a first surface of the wiring member and a second connecting electrode formed on a second surface of the wiring member;

forming an external connecting terminal on the second connecting electrode; and forming a first reinforcing member on the whole second surface of the wiring member including a bonding position of the external connecting terminal and the second connecting electrode except for the external connecting terminal by molding a resin.

According to a further aspect of the invention, a method of manufacturing a wiring board comprises steps of:

forming a wiring member having wiring layers and insulating layers, the wiring layers including a first connecting electrode formed on a first surface of the wiring member and a second connecting electrode formed on a second surface of the wiring member;

forming a first reinforcing member on the whole second surface of the wiring member except for the second connecting electrode by molding a resin; and forming an external connecting terminal on the second connecting electrode after forming the first reinforcing member.

In the invention, moreover, there may further be provided a step of providing an electronic component on the second surface of the wiring member, wherein the electronic component is sealed with the first reinforcing member when molding the first reinforcing member.

In the invention, furthermore, when the first reinforcing member is to be molded, a second reinforcing member may be simultaneously molded on the first surface except for the first connecting electrode.

In the invention, moreover, there may further be provided a step of cutting the wiring member together with the first reinforcing member to obtain a wiring board after forming the first reinforcing member.

In the invention, furthermore, the first reinforcing member having a larger shape than the wiring member may be formed, and there may further be provide a step of cutting the first reinforcing member to obtain a wiring board after forming the first reinforcing member.

According to the invention, the first reinforcing member is molded over almost the whole second surface of the wiring member. As compared with a related-art frame-shaped reinforcing member, therefore, it is possible to prevent a deformation from being generated over almost the whole surface of the wiring member more reliably. Thus, it is possible to enhance a reliability of the wiring board.

When the first reinforcing member is to be formed over almost the whole second surface of the wiring member, moreover, it is formed to include the terminal provided on the second connecting electrode of the second surface. Therefore, it is also possible to hold the terminal through the first reinforcing member.

Other features and advantages may be apparent from the following detailed description, the accompanying drawings and the claims.

DETAILED DESCRIPTION

Next, the best mode for carrying out the invention will be described with reference to the drawings.

Figure 1A:
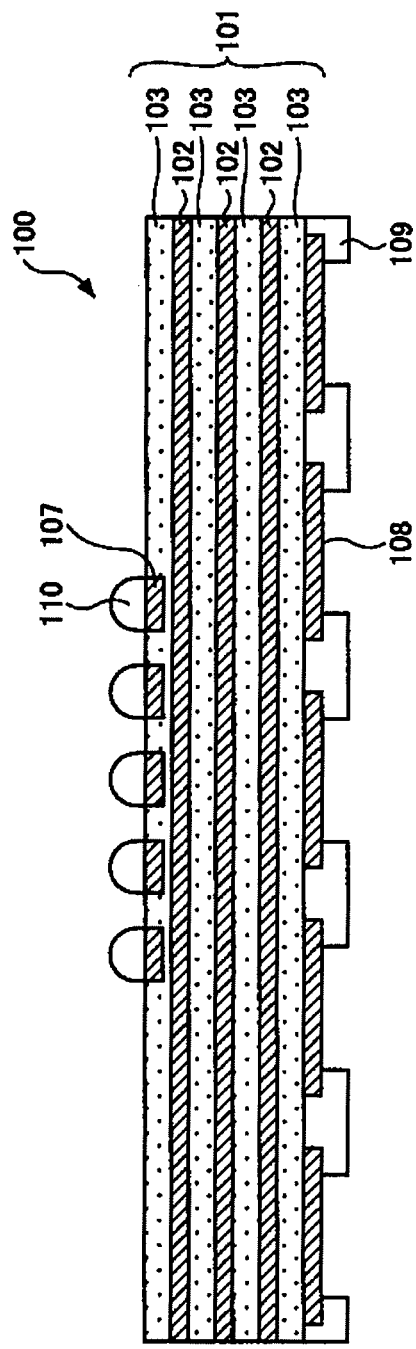
FIGS. 1A and 1B are views for explaining a wiring board according to a related-art example and a problem thereof.
Figure 1B:
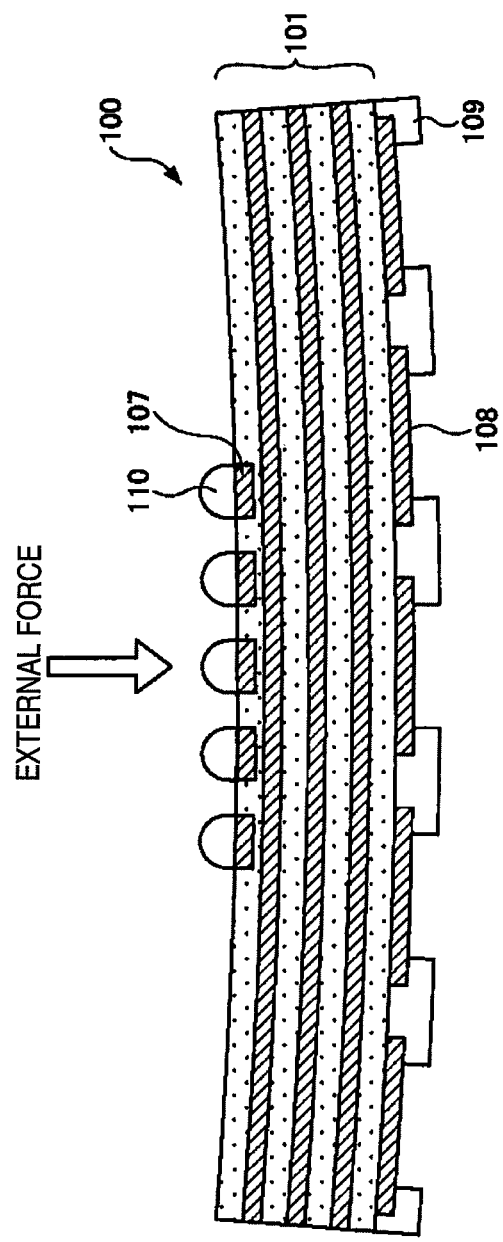
Figure 2:
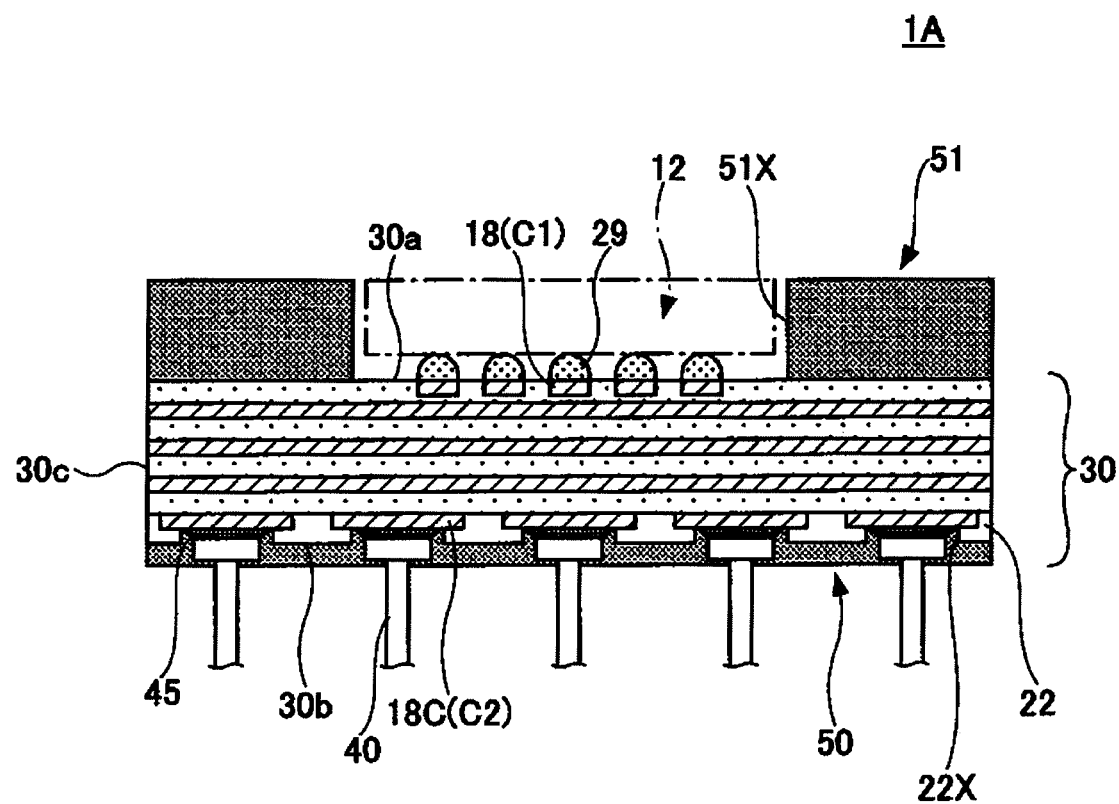
FIG. 2 is a sectional view showing a wiring board according to a first embodiment of the invention.

FIG. 2 is a view typically showing a wiring board 1A according to a first embodiment of the invention. The wiring board 1A according to the embodiment is roughly constituted by a wiring member 30, a first reinforcing member 50, and a second reinforcing member 51. The wiring member 30 has a structure in which insulating layers and wiring layers are stacked as will be described below in detail in a process for manufacturing the wiring board 1A (see FIG. 5C).

A solder bump 29 connected to a first wiring layer 18 to be a first connecting terminal C1 (which will also be referred to as a connecting pad 18 in the description) is disposed on a surface 30a of the wiring member 30. Moreover, a solder resist 22 is formed on a back surface of the wiring member 30, and an opening portion 22X is provided on the solder resist 22. A fourth wiring layer 18c (the second connecting electrode) to be a second connecting terminal C2 is positioned in the opening portion 22X.

A pin 40 is bonded to the fourth wiring layer 18c by using a solder 45. The pin 40 functions as an external connecting terminal of the wiring board 1A.

The first and second reinforcing members 50 and 51 function as reinforcing members (stiffeners) of the wiring member 30. The first and second reinforcing members 50 and are molded by using a metal mold 19A as will be described below. Moreover, it is possible to apply an epoxy based resin to be a plastic package material (for example, an epoxy resin used as a sealing material of a semiconductor device) as a molding resin for forming the first and second reinforcing members 50 and 51. In this case, it is possible to regulate the strengths of the first and second reinforcing members 50 and 51 by adjusting a content of a filler such as silica. It is desirable that the content of the filler should be set to be 85 to 90 wt %, for example.

The second reinforcing member 51 is formed on the surface 30a (the first surface) of the wiring member 30. The second reinforcing member 51 has an opening portion 51X formed on a central part thereof. The connecting pad 18 (the first connecting electrode) is constituted to be positioned in the opening portion 51X. An electronic element 12 such as a semiconductor chip is mounted on the opening portion 51X as shown in a one-dotted chain line in the drawing. In order to connect the electronic element 12 to the connecting pad 18 (the solder bump 29), the opening portion 51X is formed on the second reinforcing member 51.

In this case, it is also possible to employ a structure in which a height of the second reinforcing member 51 from the surface 30a of the wiring member 30 is set to be equal to a height of a back surface of the electronic element 12 in a mounting state on the wiring member 30 from the surface 30a of the wiring member 30. By the structure, the back surface of the electronic element 12 is on the level with a surface of the second reinforcing member 51. For example, a height of the second reinforcing member 51 from the surface 30a of the wiring member 30 is 1 mm, a height of the wiring member 30 is 0.7 mm, and a height of the first reinforcing member 50 from the back surface 30b of the wiring member 30 is 0.3 mm. If it is necessary to provide a radiator fin for cooling the electronic element 12, it is possible to easily carry out a thermal connection of the radiator fin and the electronic element 12.

On the other hand, the first reinforcing member 50 is formed on a back surface 30b (a second surface) of the wiring member 30. The first reinforcing member 50 is formed over the whole back surface 30b of the wiring member 30. In the embodiment, particularly, the first reinforcing member 50 is disposed in the opening portion 22X. Accordingly, the first reinforcing member 50 is formed on the back surface 30b to include a bonding position of the fourth wiring layer 18c and the pin 40.

The mechanical strength of the wiring board 1A having the structure will be taken into consideration.

The second reinforcing member 51 is formed on the surface 30a of the wiring member 30. Consequently, it is possible to enhance a mechanical strength of the wiring member 30. However, it is necessary to form the opening portion 51X on the second reinforcing member 51 in order to mount the electronic element 12 as described above. With a reinforcing structure in which only the second reinforcing member 51 is simply provided on the surface 30a of the wiring member 30, accordingly, a mechanical strength in the second reinforcing member 51 is reduced so that a sufficient strength cannot be obtained.

In the embodiment, therefore, there is employed a structure in which the first reinforcing member 50 is formed on the whole back surface 30b of the wiring member 30. By forming the first reinforcing member 50 and the second reinforcing member 51 to interpose the wiring member 30 therebetween, thus, it is possible to increase the mechanical strength of the wiring board 1A.

In this case, thicknesses of the first reinforcing member 50 and the second reinforcing member 51 can be properly set corresponding to a degree of warpage generated on the wiring member 30. For example, it is also possible to set the first reinforcing member 50 and the second reinforcing member 51 to have equal thicknesses.

Moreover, the first reinforcing member 50 is also formed in an opposed position to the opening portion 51X which is formed on the second reinforcing member 51. Therefore, a mechanical strength in an opposed portion to the opening portion 51X in the wiring member 30 can be increased by the first reinforcing member 50 more greatly. Consequently, the wiring member 30 has a mechanical strength increased over a whole part thereof. Accordingly, it is possible to prevent a deformation from being generated in the wiring board 1A by an application of an external force.

In the embodiment, furthermore, the first reinforcing member 50 also enters in the opening portion 22A of the solder resist 22 so that a bonding position of the pin 40 and the fourth wiring layer 18c is also covered with the first reinforcing member 50. For this reason, the bonding position of the pin 40 and the fourth wiring layer 18c is also reinforced by the first reinforcing member 50 so that a bonding strength of the pin 40 to the fourth wiring layer 18c can be increased.

Next, description will be given to the method of manufacturing the wiring board 1A. FIGS. 3A to 7C are views for explaining the method of manufacturing the wiring board 1A according to the first embodiment of the invention.

Figure 3A:
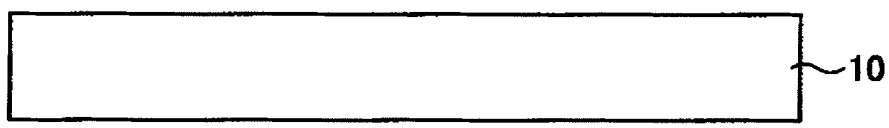
FIGS. 3A to 3C are sectional views (No. 1) for explaining a method of manufacturing the wiring board according to the first embodiment of the invention.
Figure 3B:
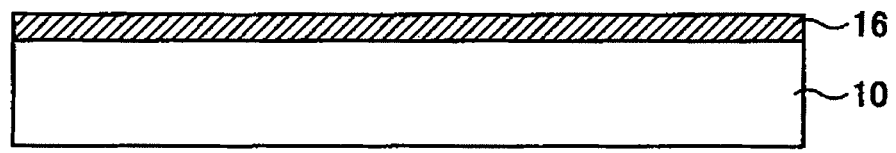

In order to manufacture the wiring board 1A, a support 10 is first prepared as shown in FIG. 3A. In the embodiment, a copper foil is used as the support 10. A thickness of the copper foil is 35 to 100 μm, for example. A resist film 16 is formed on the support 10 as shown in FIG. 3B. A dry film can be utilized for the resist film 16, for example.

Figure 3C:
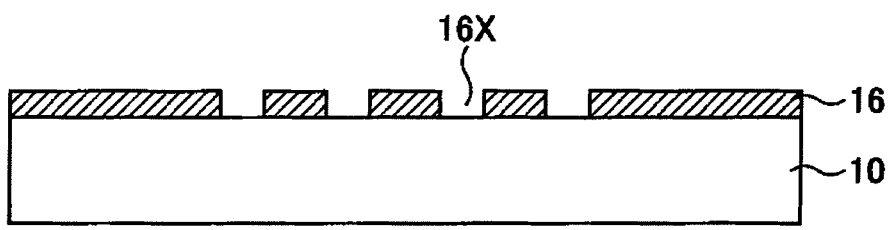

Next, a patterning treatment is carried out for the resist film 16 and an opening portion 16X is formed on a predetermined part (a corresponding position to a position in which the connecting pad 18 is formed which will be described below) as shown in FIG. 3C. It is also possible to previously form the opening portion 16X on the resist film 16 taking a shape of a dry film and to dispose, on the support 10, the resist film 16 having the opening portion 16X formed thereon.

Figure 4A:
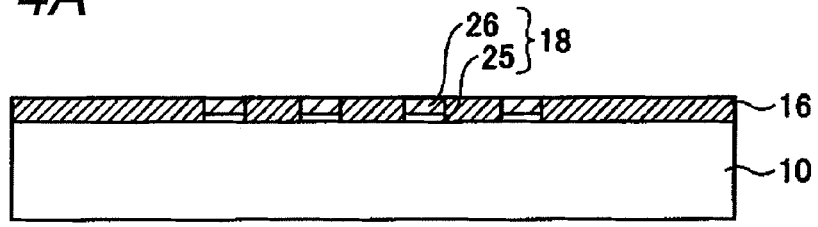
FIGS. 4A to 4E are sectional views (No. 2) for explaining the method of manufacturing the wiring board according to the first embodiment of the invention.

As shown in FIG. 4A, next, the connecting pad 18 serving as a first wiring layer is formed on the support 10 by electrolytic plating utilizing the support 10 for a plating feeding layer. The connecting pad 18 is provided in the opening portion 16X formed on the resist film 16 and is constituted by a pad surface plated layer 25 and a pad body 26.

The pad surface plated layer 25 has a structure in which an Au film, a Pd film and a Ni film are provided. In order to form the connecting pad 18, accordingly, the Au film, the Pd film and the Ni film are first plated in order to form the pad surface plated layer 25 and to subsequently form the pad body 26 constituted by Cu on the pad surface plated layer 25 through plating.

Figure 4B:
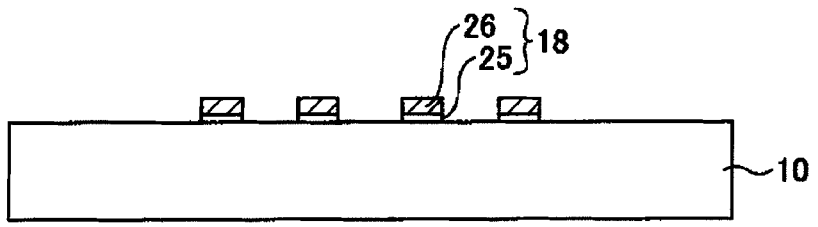

When the connecting pad 18 is formed, thus, the resist film 16 is then removed as shown in FIG. 4B. The connecting pad 18 functions as a first connecting terminal C1 to be connected to an electronic element 12.

Figure 4C:
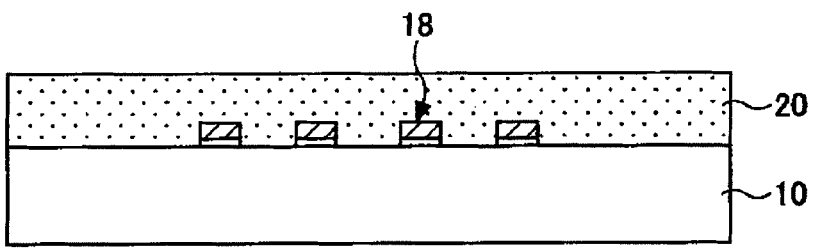

As shown in FIG. 4C, subsequently, a first insulating layer 20 for covering the connecting pad 18 is formed on the support 10. For a material of the first insulating layer 20, a resin material such as an epoxy based resin or a polyimide based resin is used. As an example of a method of forming the first insulating layer 20, a resin film is provided on the support 10 and is then pressed, and treated thermally and cured at a temperature of 130 to 150° C. so that the first insulating layer 20 can be obtained.

Figure 4D:
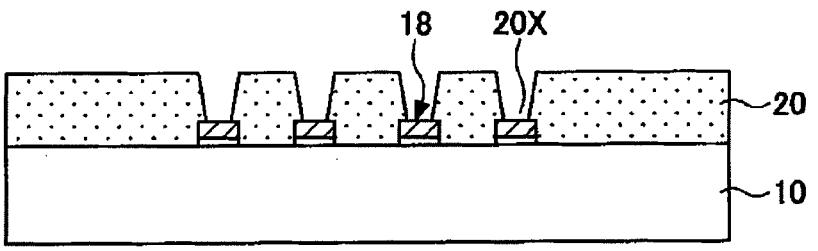

As shown in FIG. 4D, thereafter, a first via hole 20X is provided on the first insulating layer 20 formed on the support 10 by using a laser processing method in such a manner that the connecting pad 18 is exposed. The first insulating layer 20 may be formed by patterning a photosensitive resin film through photolithography or a method of patterning a resin film provided with an opening portion through screen printing may be used.

Figure 4E:
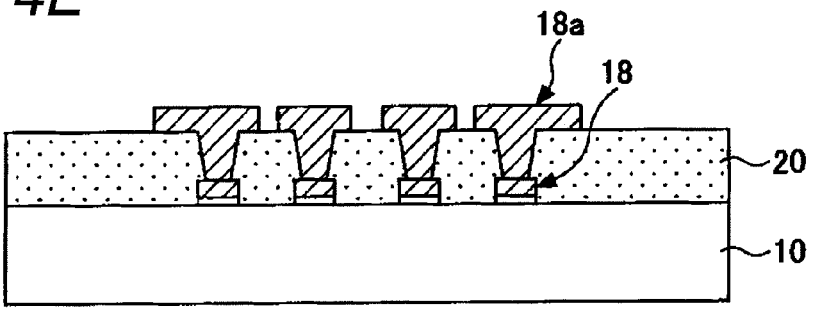

As shown in FIG. 4E, next, a second wiring layer 18a to be connected through the first via hole 20X to the connecting pad 18 (constituting the first wiring layer) is formed on the support 10. The second wiring layer 18a is constituted by Cu (copper) and is formed on the first insulating layer 20. The second wiring layer 18a is formed by a semiadditive method, for example.

Detailed description will be given. A Cu seed layer (not shown) is first formed in the first via hole 20X and on the first insulating layer 20 by a nonelectrolytic plating or sputtering method and a resist film (not shown) including an opening portion corresponding to the second wiring layer 18a is then formed. Next, a Cu layer pattern (not shown) is formed on the opening portion of the resist film by electrolytic plating utilizing the Cu seed layer as a plating feeding layer.

Subsequently, the resist film is removed and the Cu seed layer is then etched by using the Cu layer pattern as a mask. Thus, the second wiring layer 18a is obtained. For a method of forming the second wiring layer 18a, it is possible to employ various wiring forming methods such as a subtractive method in addition to the semiadditive method.

Figure 5A:
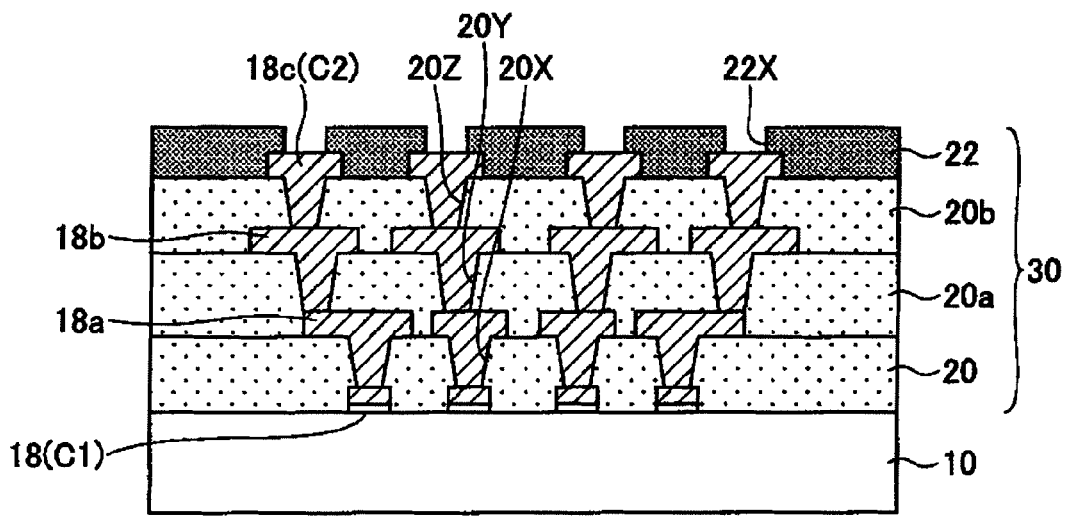
FIGS. 5A to 5C are sectional views (No. 3) for explaining the method of manufacturing the wiring board according to the first embodiment of the invention.

As shown in FIG. 5A, next, the same processing is repeated. Consequently, a second insulating layer 20a covering the second wiring layer 18a is formed on the support 10 and a second via hole 20Y is then formed in a portion of the second insulating layer 20a which is provided on the second wiring layer 18a. Furthermore, a third wiring layer 18b to be connected to the second wiring layer 18a is formed on the second insulating layer 20a of the support 10 through the second via hole 20Y.

Furthermore, a third insulating layer 20b covering the third wiring layer 18b is formed on the support 10 and a third via hole 20Z is then formed on a portion of the third insulating layer 20b which is provided on the third wiring layer 18b. In addition, a fourth wiring layer 18c to be connected to the third wiring layer 18b through the third via hole 20Z is formed on the third insulating layer 20b of the support 10.

Subsequently, a solder resist film 22 having the opening portion 22X provided thereon is formed on the fourth wiring layer 18c of the support 10. Consequently, the fourth wiring layer 18c exposed into the opening portion 22X of the solder resist film 22 serves as a second connecting terminal C2.

Moreover, a first reinforcing member 50 is formed on a surface at a side where the fourth wiring layer 18c in the wiring member 30 is provided as will be described below. The first reinforcing member 50 functions as the solder resist 22. Therefore, it is also possible to omit the formation of the solder resist 22.

It is also possible to form a contact layer such as an Ni/Au plated layer on the fourth wiring layer 18c in the opening portion 22X of the solder resist film 22 if necessary.

Thus, a predetermined build-up wiring layer is formed on the connecting pad 18 (the first connecting terminal C1) provided on the support 10. Although four build-up wiring layers (the first to fourth wiring layers 18 to 18c) are formed in the example, n (n is an integer of one or more) build-up wiring layer(s) may be formed.

Figure 5B:
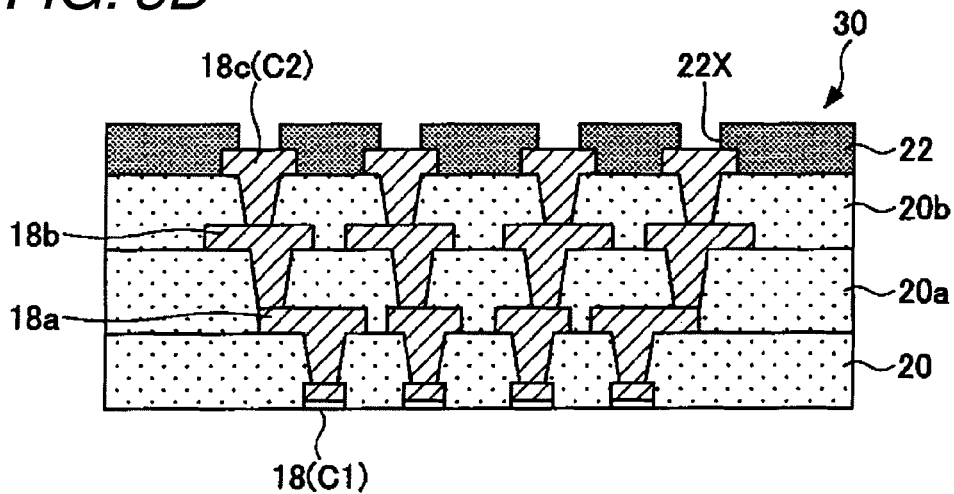

Next, the support 10 is removed as shown in FIG. 5B. The support 10 can be removed by wet etching using a ferric chloride solution, a cupric chloride solution or an ammonium persulfate solution. In this case, the connecting pad 18 has the pad surface plated layer 25 formed on a surfacemost part. Therefore, it is possible to selectively etch and remove the support 10 with respect to the first wiring layer 18 and the first insulating layer 20. Consequently, the connecting pad 18 functioning as the first connecting terminal C1 is exposed from the first insulating layer 20 so that there is formed the wiring member 30 having a structure in which the wiring layers 18, 18a, 18b and 18c and the insulating layers 20, 20a and 20b are stacked.

Figure 5C:
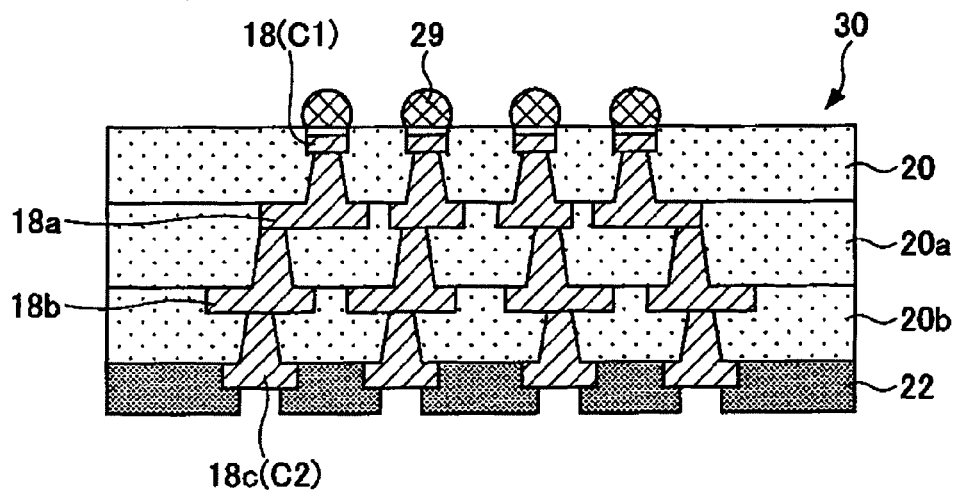

In the embodiment, next, a solder bump 29 (a bonding metal) is formed on the connecting pad 18 as shown in FIG. 5C. The solder bump 29 is obtained by printing a solder on the connecting pad 18 exposed from the first insulating layer 20 and attaching, to a reflow furnace, the wiring member 30 subjected to the solder printing, thereby carrying out a reflow treatment. The solder bump 29 can also be formed after the reinforcing members 50 and 51 are provided on the wiring member 30 which will be described below.

Subsequently, the pin 40 is bonded to the fourth wiring layer 18c by using a solder 45. Consequently, there is formed the wiring member 30 in which the solder bump 29 is provided on the connecting pad 18 shown in FIG. 6A and the pin 40 is provided on the fourth wiring layer 18c. In the case in which the support 10 is a multicavity substrate, there is added a step of cutting (dicing) the wiring member 30 in a corresponding region to the individual wiring board 1A, thereby cutting the wiring board 1A into pieces after the end of the step shown in FIG. 5B or 5C.

Figure 6A:
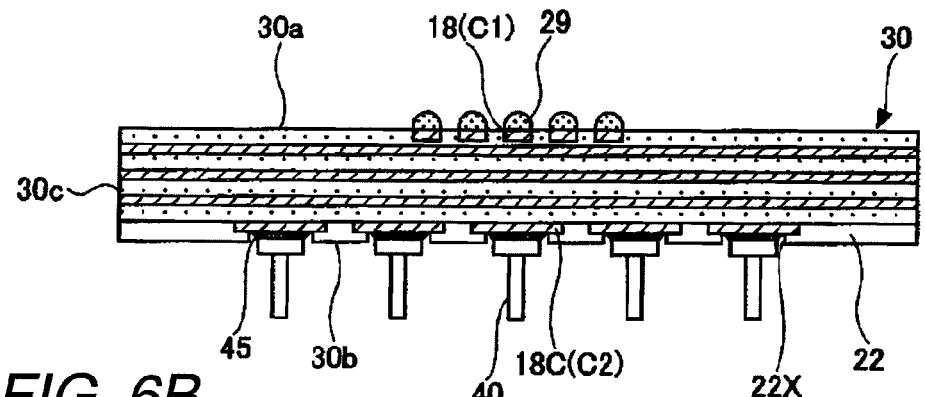
FIGS. 6A to 6C are sectional views (No. 4) for explaining the method of manufacturing the wiring board according to the first embodiment of the invention.

FIG. 6A is a view simply showing the wiring member 30. In each of the drawings after FIG. 6A, for convenience of illustration, the wiring member 30 is simply shown as in FIG. 6A.

Figure 6B:
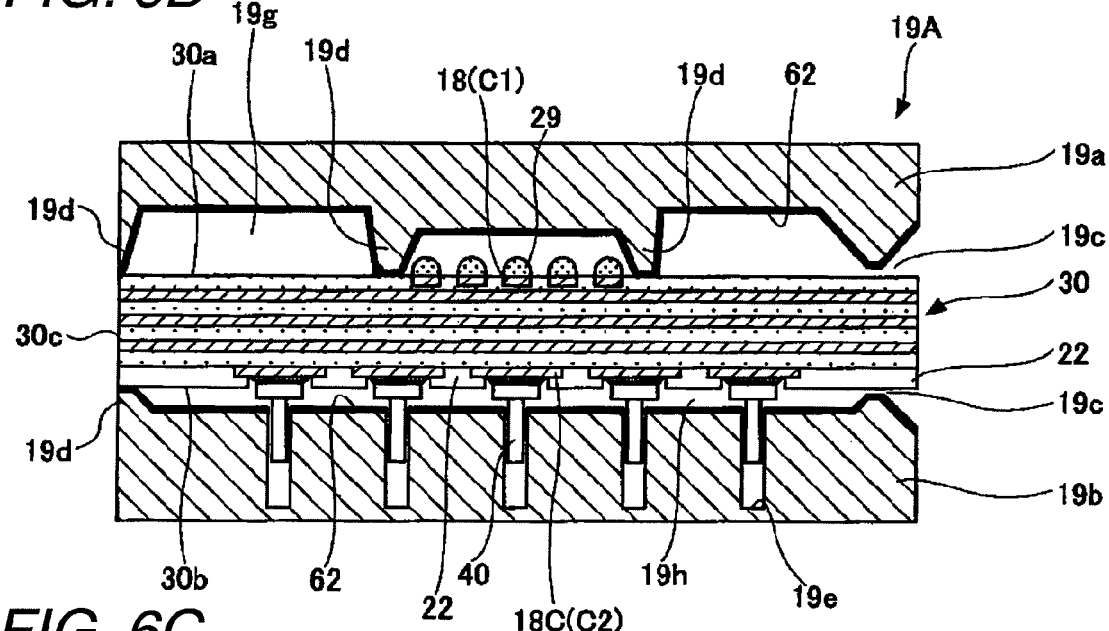

Subsequently, a step of molding the first reinforcing member 50 and a second reinforcing member 51 is executed for the wiring member 30 shown in FIG. 6A. In order to mold the first and second reinforcing members 50 and 51, the wiring member 30 is attached to a metal mold 19A as shown in FIG. 6B.

The metal mold 19A is constituted by an upper mold 19a and a lower mold 19b. Cavities 19g and 19h corresponding to shapes of the first and second reinforcing members 50 and 51 to be molded are formed on the inside of the upper mold 19a and the lower mold 19b. Moreover, a dam portion 19d is formed in predetermined positions of the upper mold 19a and the lower mold 19b, and a pin inserting recess portion 19e for inserting the pin 40 provided on a back surface 30b of the wiring member 30 is formed on the lower mold 19b.

Moreover, a release film 62 is provided on internal walls of the upper mold 19a and the lower mold 19b (internal walls of the cavities 19g and 19h). The release film 62 is provided for preventing a molding resin 60 from directly coming in contact with the internal walls of the upper mold 19a and the lower mold 19b.

For the release film 62, there is selected a material which has a heat resistance to a heating temperature of a metal mold and can easily be peeled from the internal walls of the upper mold 19a and the lower mold 19b, and has a flexibility and an extensibility for an easy deformation in conformity to the shapes of the cavities 19g and 19h. More specifically, it is possible to use, for the release film 62, PTFE, ETFE, PET and FEP films, a fluorine impregnating glass cloth, a polypropylene film, and polyvinylidine chloride, for example. The release film 62 may have such a structure as to be automatically fed to the metal mold 19A.

In a state in which the wiring member 30 is attached to the metal mold 19A, the dam portion 19d abuts on predetermined positions of the surface 30a and the back surface 30b in the wiring member 30. The pin 40 breaks the release film 62 and is thus inserted into the pin inserting recess portion 19e.

In the embodiment, the dam portion 19d abuts on the surface 30a and the back surface 30b in the wiring member 30. Accordingly, a side surface 30c is exposed from the metal mold 19A. Moreover, a part of the dam portion 19d is provided to surround the solder bump 29. Therefore, the solder bump 29 is prevented from being sealed with the molding resin 60.

Furthermore, the pin 40 breaks the release film 62 and is thus inserted into the pin inserting recess portion 19e. However, the release film 62 maintains an adhering state to the pin 40. Therefore, the molding resin 60 can be prevented from entering the pin inserting recess portion 19e. A resin injecting port 19c for injecting the molding resin 60 into the cavities 19g and 19h is formed between the wiring member 30 and the metal mold 19A at a right end in the drawing.

Figure 6C:
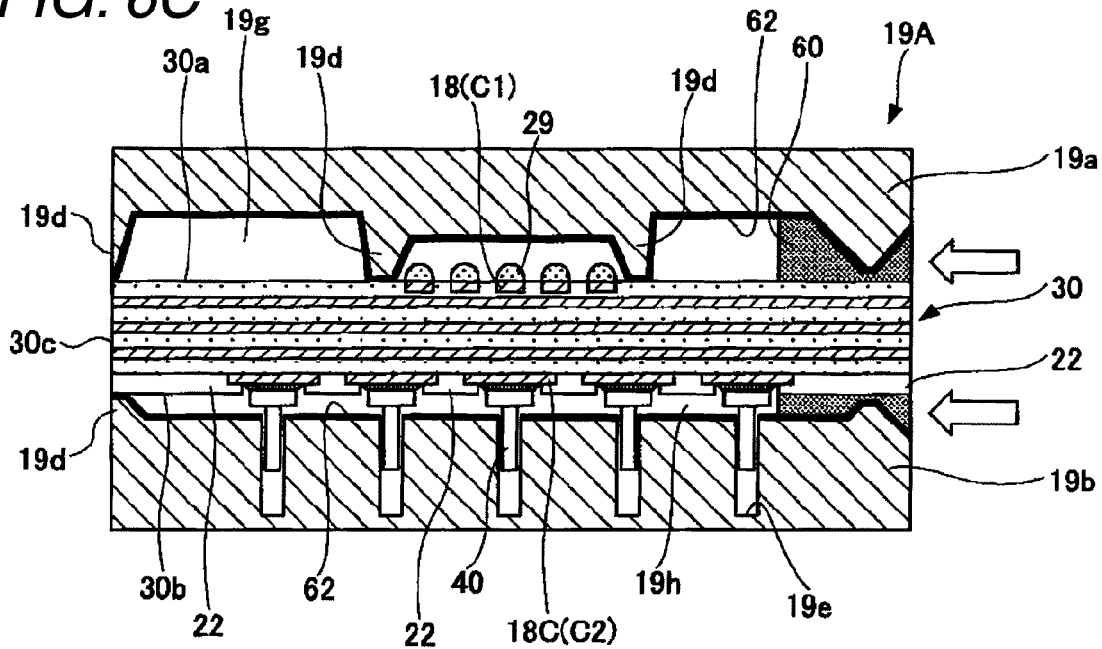

When the wiring member 30 is attached to the metal mold 19A, the molding resin 60 is injected through the resin injecting port 19c from a resin feeding device (not shown) into the metal mold 19A as shown in FIG. 6C.

As described above, the upper mold 19a is provided with the dam portion 19d for blocking the progress of the molding resin 60 in order to surround a region in which the solder bump 29 is formed. Therefore, the solder bump 29 can be prevented from being sealed with the molding resin 60. Consequently, the second reinforcing member 51 having the opening portion 51X surrounding the solder bump 29 is molded on the surface 30A of the wiring member 30.

On the other hand, the dam portion 19d formed on the lower mold 19b abuts on the back surface 30b over an outer periphery of the wiring member 30. Consequently, the molding resin 60 injected from the resin injecting port 19c is supplied to the whole back surface 30b of the wiring member 30. Thus, the first reinforcing member 50 is molded to cover the whole back surface 30b including the bonding position of the second connecting terminal C2 to the pin 40.

Figure 7A:
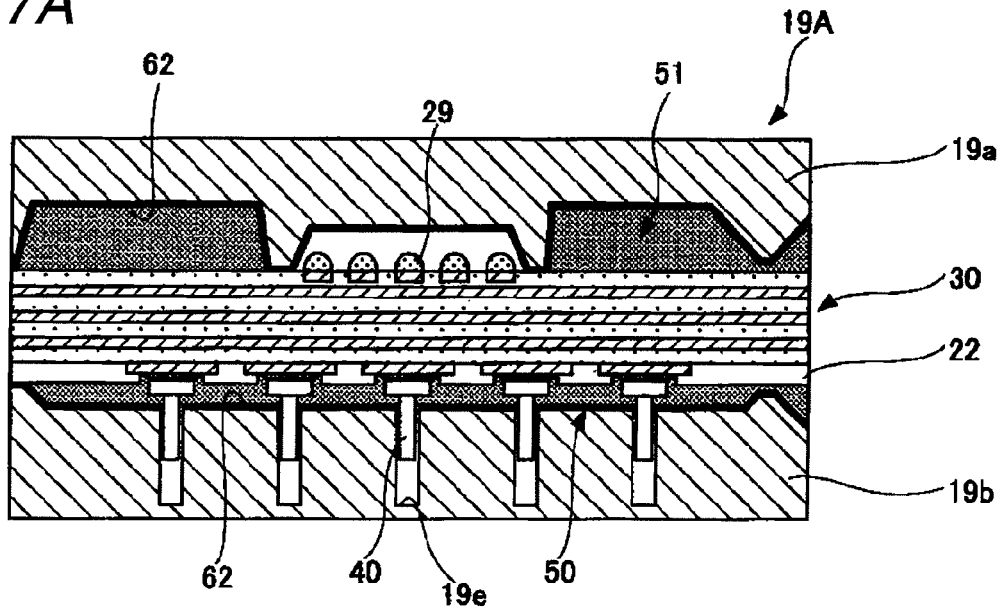
FIGS. 7A to 7C are sectional views (No. 5) for explaining the method of manufacturing the wiring board according to the first embodiment of the invention.
Figure 7B:
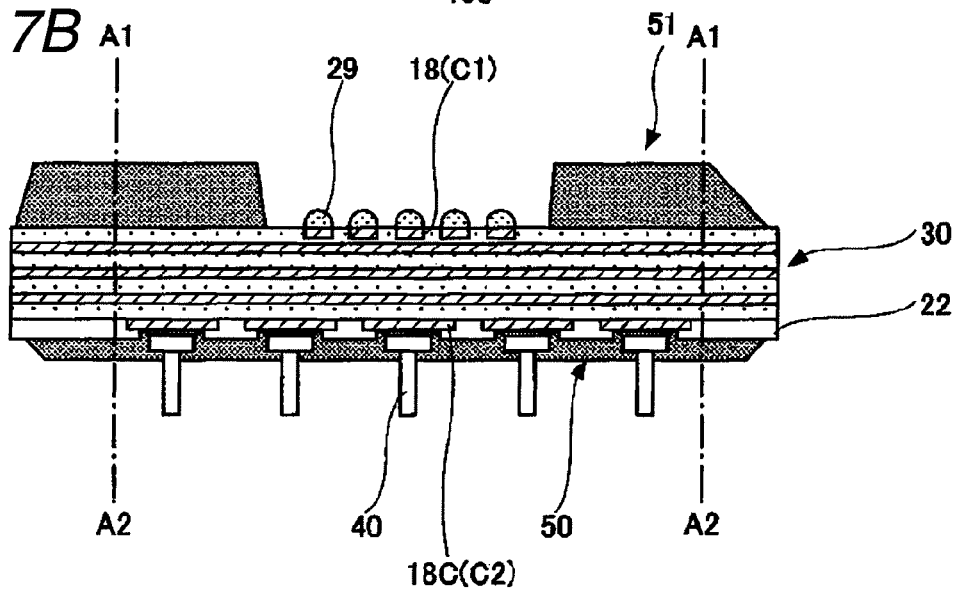
Figure 7C:
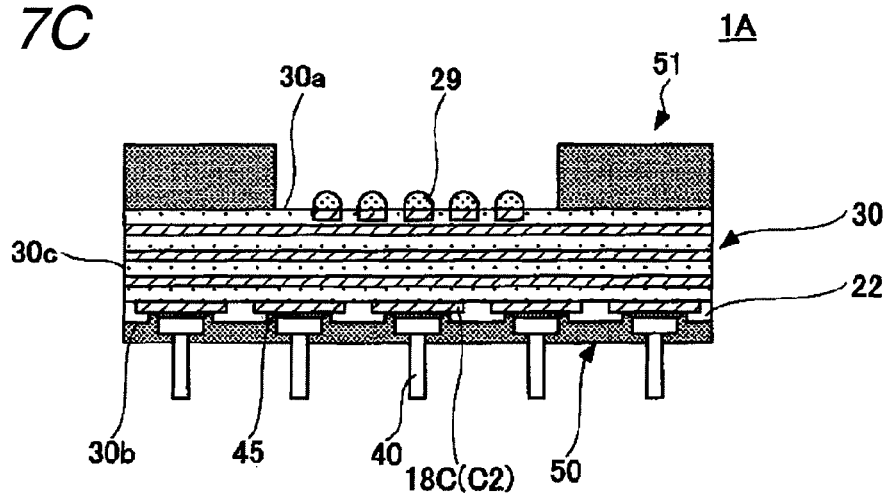

FIG. 7A shows a state in which the first reinforcing member 50 and the second reinforcing member 51 are molded in the metal mold 19A. When the first and second reinforcing members 50 and 51 are molded, thus, the wiring member 30 in which the reinforcing members 50 and 51 are molded is released from the metal mold 19A. FIG. 7B shows the wiring member 30 taken out of the metal mold 19A. Subsequently, a processing for cutting the wiring member 30 and the reinforcing member 50 and 51 is carried out in a predetermined cutting position (shown in A1-A2 in the drawing) corresponding to a shape of the wiring board 1A. Consequently, the wiring board 1A shown in FIG. 7C is manufactured.

As described above, according to the manufacturing method in accordance with the embodiment, the first and second reinforcing members 50 and 51 can be molded at the same time. Therefore, it is possible to easily manufacture the wiring board 1A having a mechanical strength enhanced as described above. Also in the wiring member 30 provided with the pin 40, moreover, the pin inserting recess portion 19e is formed on the lower mold 19b and the release film 62 is provided, and furthermore, a resin molding treatment is carried out. Consequently, it is possible to prevent the molding resin 60 from entering the pin inserting recess portion 19e, thereby causing a maintenance such as cleaning for the pin inserting recess portion 19e to be unnecessary. When the first and second reinforcing members 50 and 51 are to be molded, moreover, the molding resin 60 can be prevented from sticking to the pin 40.

Figure 8A:
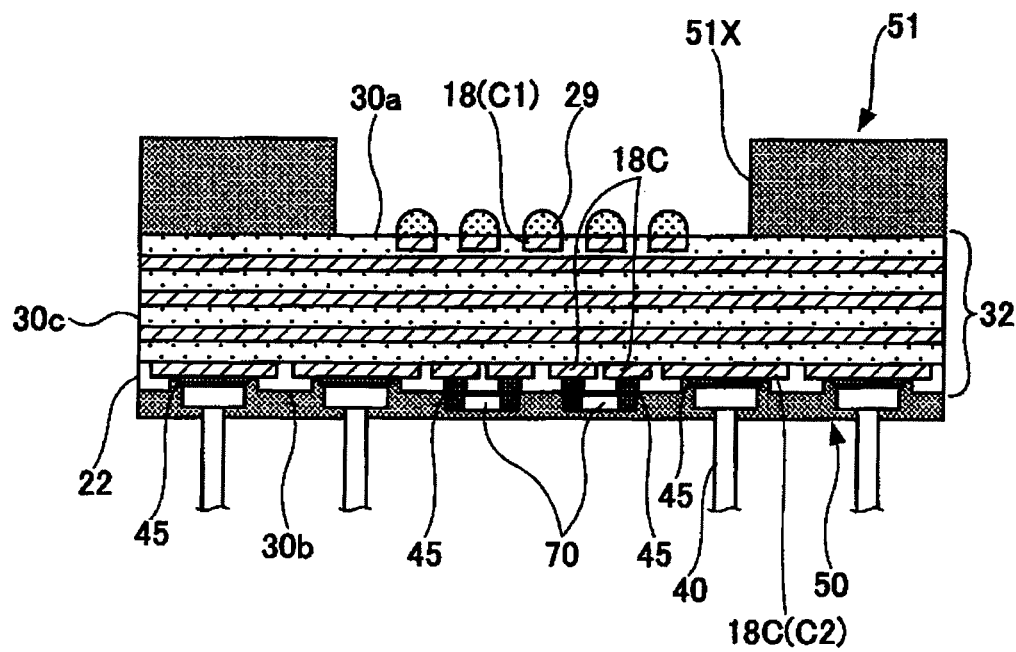
FIGS. 8A and 8B are sectional views showing a wiring board according to a second embodiment of the invention.

Next, description will be given to a wiring board and a method of manufacturing the wiring board according to a second embodiment of the invention. FIG. 8A is a sectional view showing a wiring board 1B according to the second embodiment and FIG. 9 is a view for explaining a method of manufacturing the wiring board 1B. In structures shown in FIGS. 8A to 29B which are used in the following description, corresponding structures to the structures shown in FIGS. 2 to 7C (the structures according to the first embodiment) have the same reference numerals and description thereof will be omitted.

A basic structure of the wiring board 1B according to the second embodiment is almost identical to that of the wiring board 1A according to the first embodiment described with reference to FIGS. 2 to 7C. However, the wiring board 1B according to the embodiment is characterized in that an electronic component is provided on a back surface 30b of a wiring member 32 and is sealed with a first reinforcing member 50.

In the embodiment, there will be described an example in which a chip capacitor 70 is used as an electronic component. The electronic component is not restricted to the chip capacitor but another electronic component such as a resistor or an inductor can also be provided.

The chip capacitor 70 is bonded to a fourth wiring layer 18c by using a solder 45. Also in the embodiment, the first reinforcing member 50 is molded over the whole back surface 30b. In the molding state, however, the chip capacitor 70 is buried in the first reinforcing member 50. By the structure, an insulating property from the chip capacitor 70 can be enhanced and a reliability of a so-called chip integrated board can be increased.

Figure 9A:
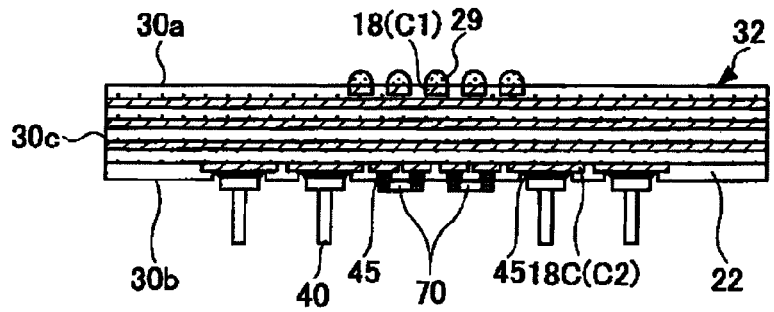
FIGS. 9A to 9D are sectional views for explaining a method of manufacturing the wiring board according to the second embodiment of the invention.

In order to manufacture the wiring board 1B according to the second embodiment having the structure, as shown in FIG. 9A, the chip capacitor 70 is previously provided on the back surface 30b of the wiring board 32 by using the solder 45. The chip capacitor 70 is a small-sized chip-shaped component. Even if the chip capacitor 70 is provided on the back surface 30b of the wiring member 32, therefore, it is not greatly protruded from the back surface 30b.

Figure 9B:
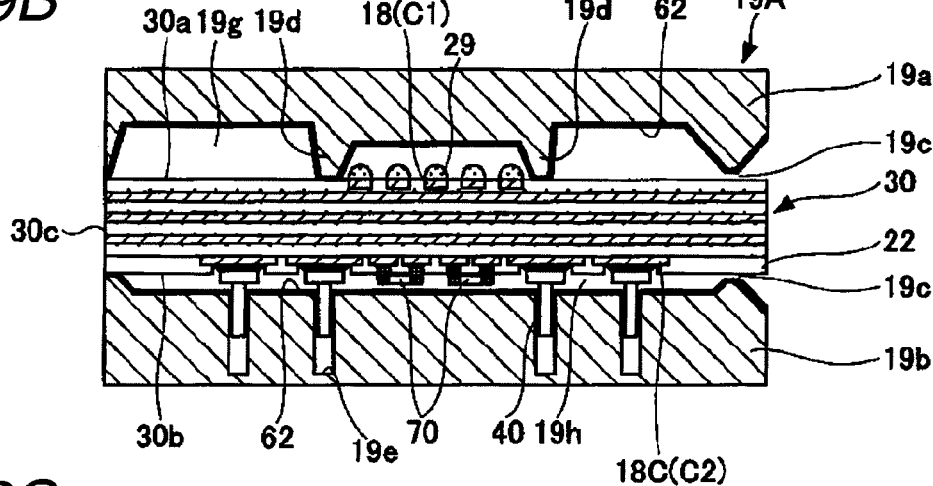

FIG. 9B shows a state in which the wiring member 32 having the chip capacitor 70 provided thereon is attached to the metal mold 19A. In this state, the chip capacitor 70 is positioned in a cavity 19h on a lower side and a gap is formed between an internal wall of the cavity 19h and the chip capacitor 70.

When the wiring member 32 is attached to the metal mold 19A, thus, the same treatment for injecting, into the metal mold 19A, the molding resin 60 as that described with reference to FIGS. 6C and 7 is executed so that the first and second reinforcing members 50 and 51 are molded. Consequently, the wiring board 1B shown in FIG. 8A is manufactured. Also in a structure in which the chip capacitor 70 is provided on the wiring member 32, thus, it is possible to manufacture the wiring board 1B by the same molding method as that in the first embodiment.

Figure 8B:
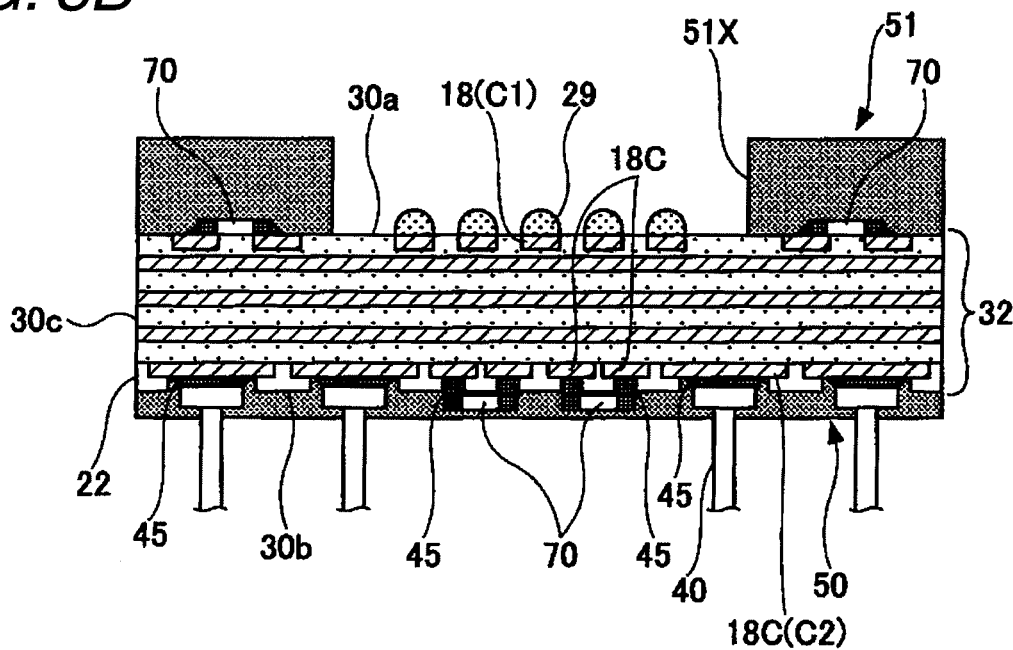
Figure 9C:
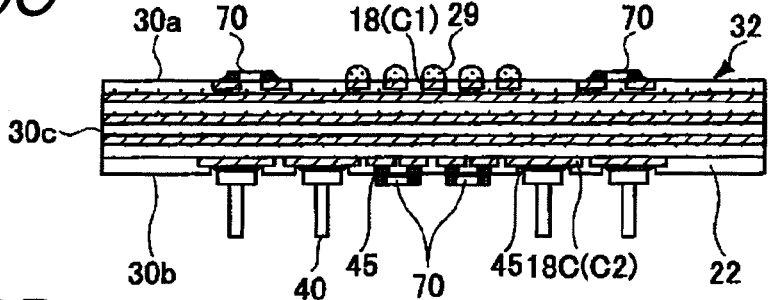
Figure 9D:
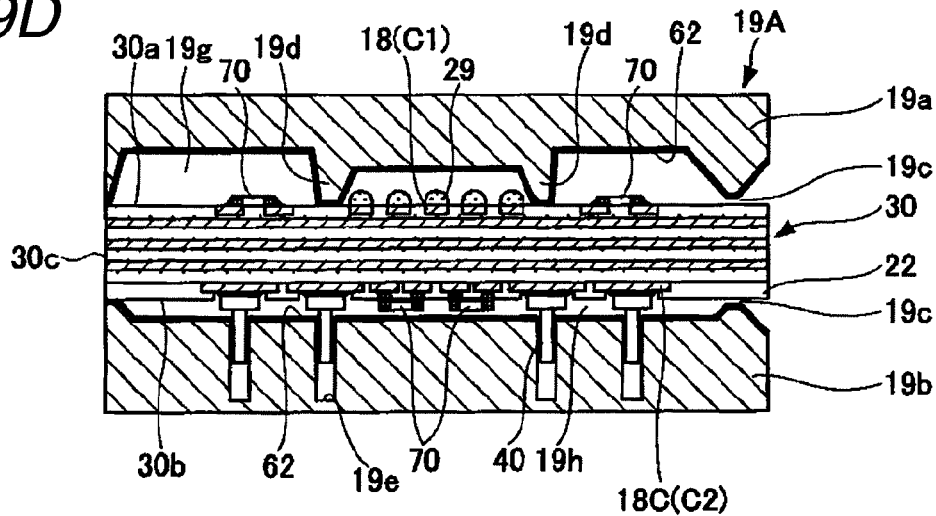

A position in which the chip capacitor 70 is provided is not restricted to the back surface 30b of the wiring member 32 but the chip capacitor 70 can also be disposed on the surface 30a of the wiring member 32 as shown in FIG. 8B. In order to manufacture the wiring board having the structure, it is preferable to previously dispose the chip capacitor 70 in predetermined positions of the wiring layers of the surface 30a and the back surface 30b in the wiring member 32 as shown in FIG. 9C. Then, the wiring member 32 provided with the chip capacitors 70 is attached to the metal mold 19A as shown in FIG. 9D and the first and second reinforcing members 50 and 51 are molded in order to cover (seal) the chip capacitor 70.

Figure 10:
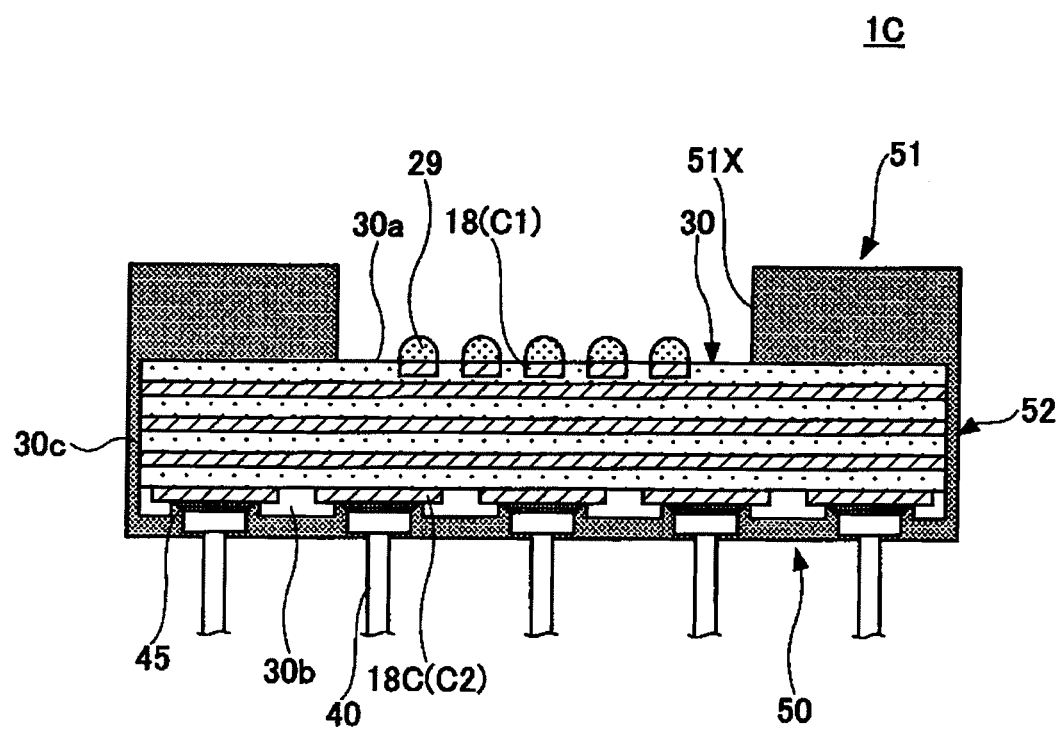
FIG. 10 is a sectional view showing a wiring board according to a third embodiment of the invention.

Next, description will be given to a wiring board and a method of manufacturing the wiring board according to a third embodiment of the invention. FIG. 10 is a sectional view showing a wiring board 1C according to the third embodiment, and FIGS. 11 and 12 are views for explaining a method of manufacturing the wiring board 1C.

The wiring board 1C according to the third embodiment also has an identical basic structure to that of the wiring board 1A according to the first embodiment described with reference to FIGS. 2 to 7C. However, the wiring board 1C according to the embodiment is characterized in that a third reinforcing member 52 is provided in an opposed position to a side surface 30c of a wiring member 30.

The wiring boards 1A and 1B according to the first and second embodiments have structures in which the second reinforcing member 51 is formed on the surfaces 30a of the wiring members 30 and 32, the first reinforcing member 50 is formed on the back surface 30b, and the side surface 30c is exposed. With a structure in which the first reinforcing member 50 and the second reinforcing member 51 are separated from each other, however, there is a possibility that a sufficient strength cannot be implemented in the case in which a greater mechanical strength is required.

On the other hand, the wiring board 1C according to the embodiment has a structure in which a third reinforcing member 52 is also formed on a side surface 30c of a wiring member 30 and a first reinforcing member 50 and a second reinforcing member 51 are connected integrally through the third reinforcing member 52. Consequently, the wiring member 30 is sealed with the first to third reinforcing members 50 to 52 except for an opposed region to the opening portion 51X. Consequently, it is possible to increase a mechanical reinforcement of the wiring board 1C more greatly.

Subsequently, description will be given to a method of manufacturing the wiring board 1C according to the third embodiment having the structure. A process for manufacturing the wiring member 30 (the steps shown in FIGS. 3A to 5C) is the same as that in the first embodiment. In the following description, therefore, description will be given to only steps of molding the first to third reinforcing members 50 to 52 with respect to the wiring member 30.

Figure 11A:
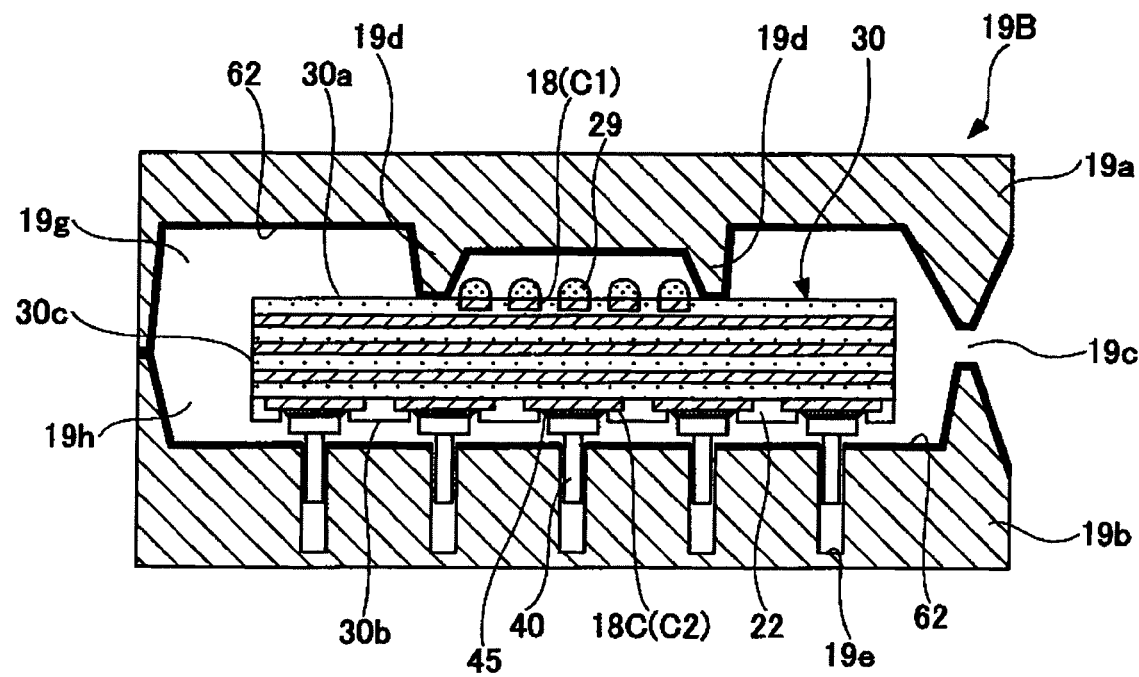
FIGS. 11A and 11B are sectional views (No. 1) for explaining a method of manufacturing the wiring board according to the third embodiment of the invention.

FIG. 11A shows a state in which the wiring member 30 is attached to a metal mold 19B. The metal mold 19B to be used in the embodiment is constituted to perfectly accommodate the wiring member 30 in cavities 19g and 19h differently from the metal mold 19A shown in FIG. 6B. More specifically, the embodiment is characterized in that a side surface 30c of the wiring member 30 is not constituted to be exposed to an outside of the metal mold 19B in a state in which the wiring member 30 is attached to the metal mold 19B.

Figure 11B:
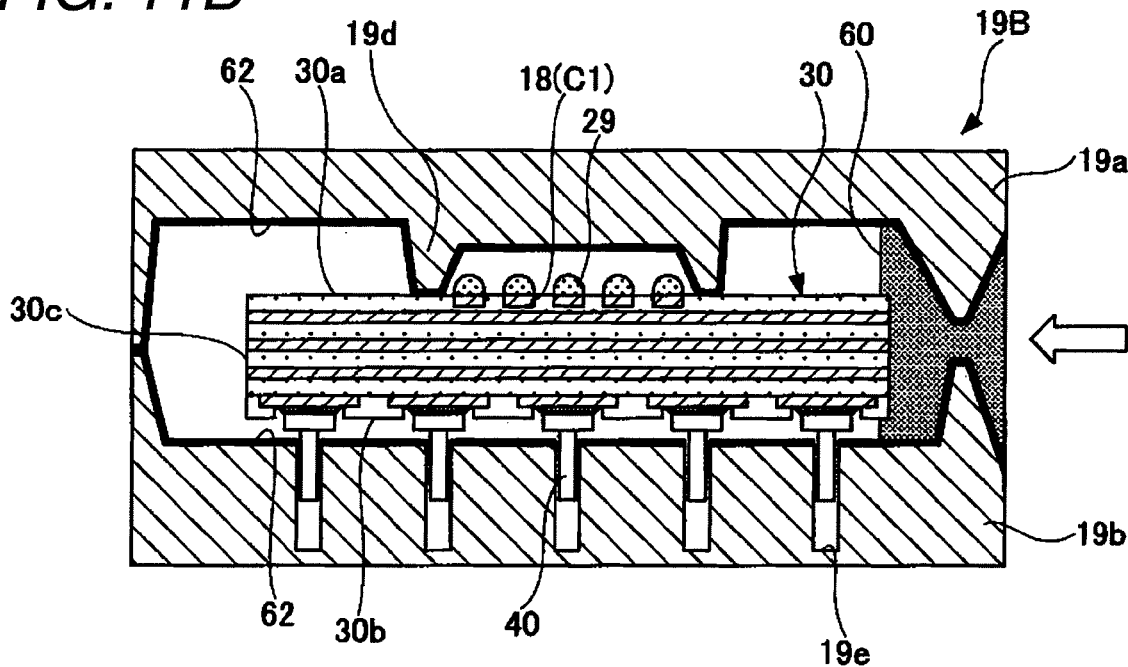
Figure 12A:
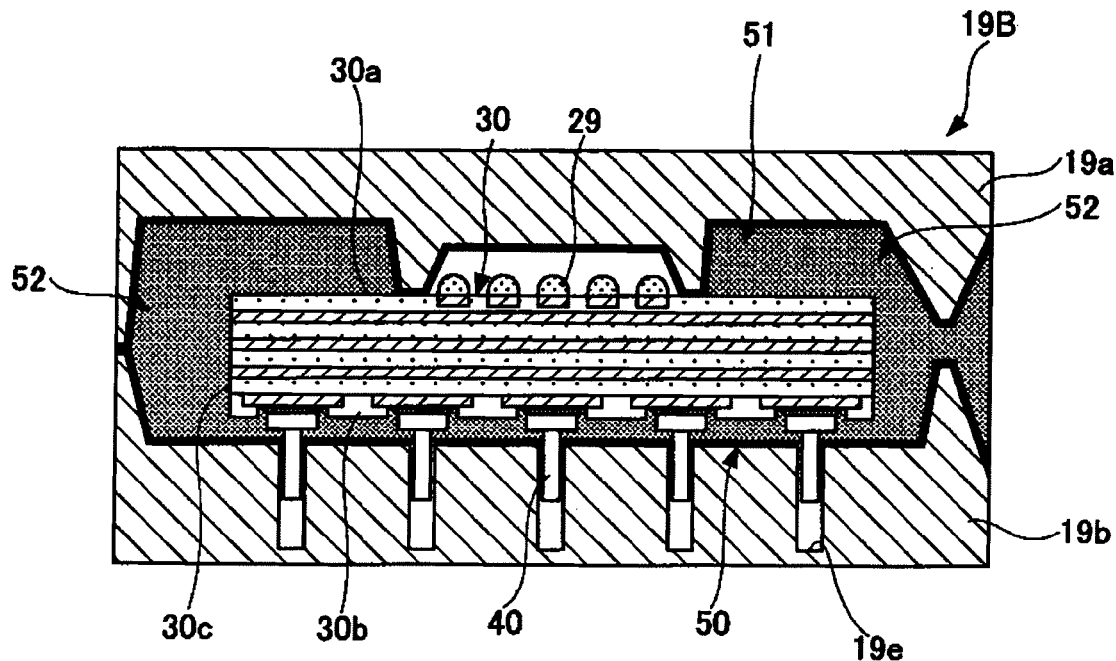
FIGS. 12A and 12B are sectional views (No. 2) for explaining the method of manufacturing the wiring board according to the third embodiment of the invention.
Figure 12B:
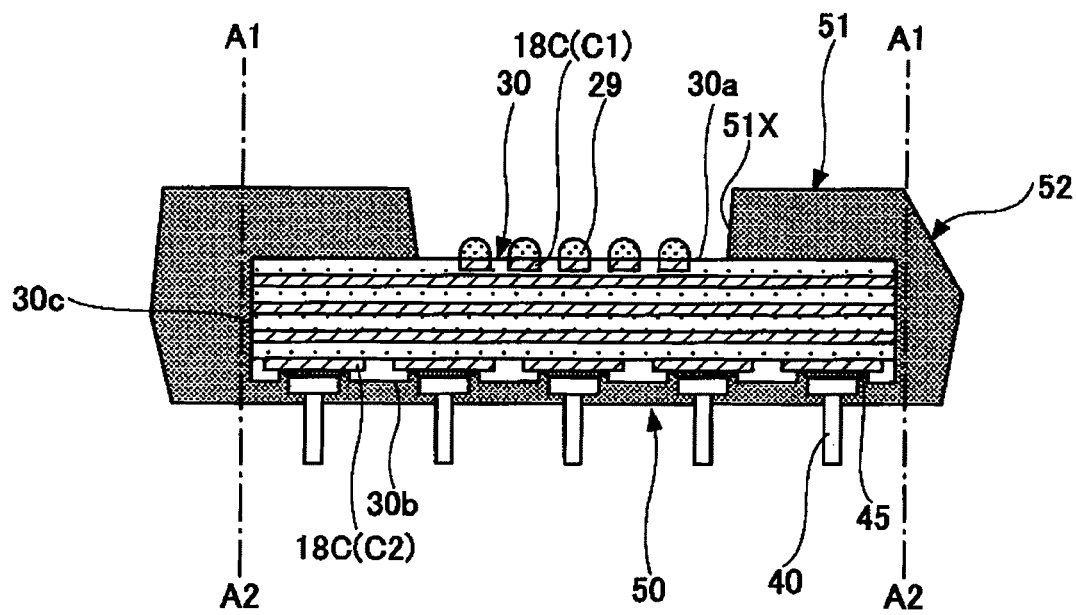

When the wiring member 30 is attached to the metal mold 19B, thus, a molding resin 60 is injected from a resin injecting port 19c into the metal mold 19B as shown in FIG. 11B. As shown in FIG. 12A, consequently, a second reinforcing member 51 is formed in an opposed position to a surface 30a of the wiring member 30 and a first reinforcing member 50 is formed in an opposed position to a back surface 30b, and furthermore, a third reinforcing member 52 is formed in an opposed position to the side surface 30c. As shown in FIG. 12B, subsequently, the wiring member 30 having the reinforcing members 50, 51 and 52 formed thereon is taken out of the metal mold 19B and a cut processing for the reinforcing member is carried out in a predetermined cutting position (shown in A1-A2 in the drawing) corresponding to a shape of the wiring board 1C. Consequently, the wiring board 1C is manufactured.

Figure 13:
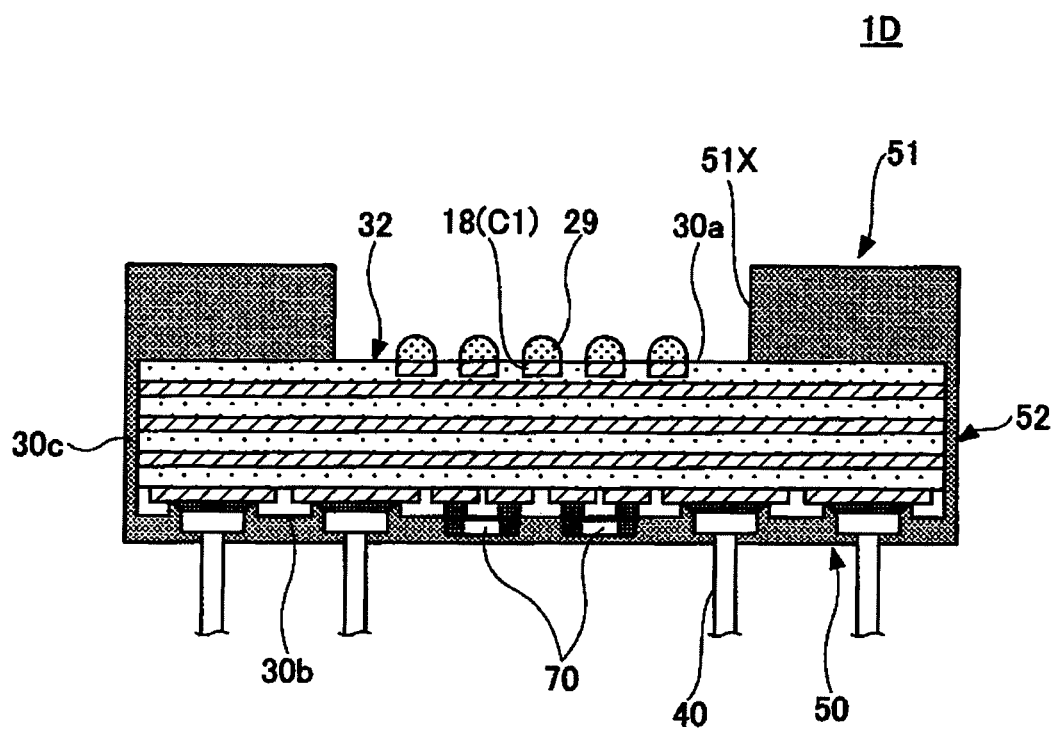
FIG. 13 is a sectional view showing a wiring board according to a fourth embodiment of the invention.
Figure 14:
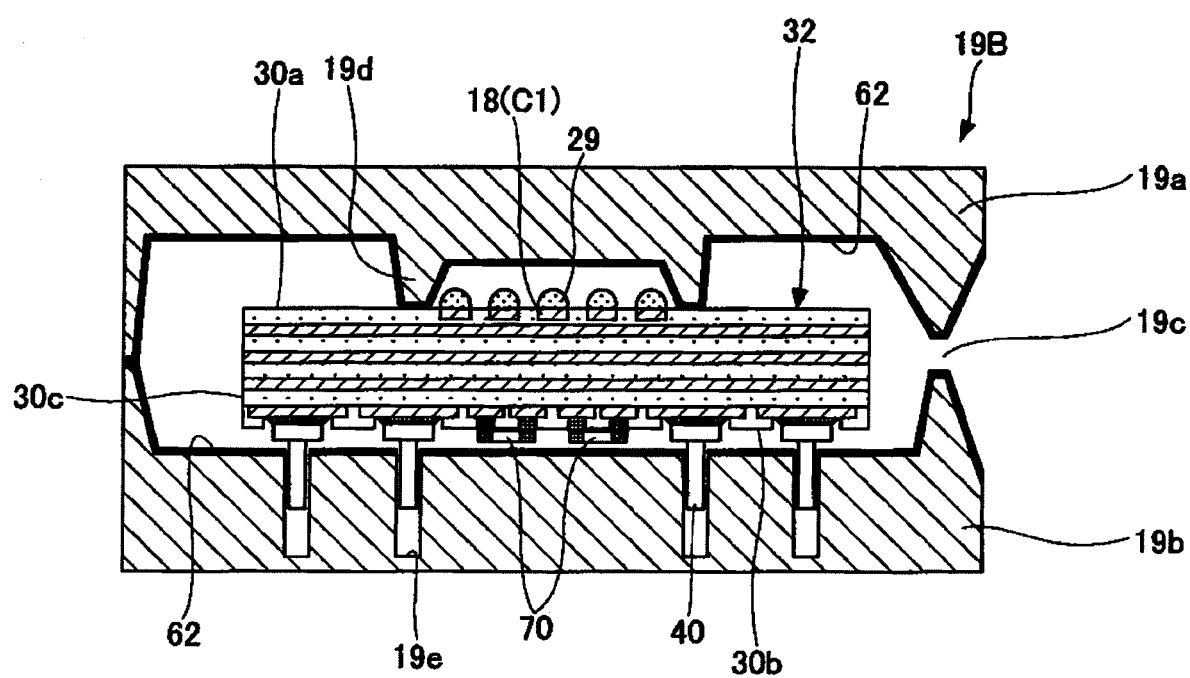
FIG. 14 is a sectional view for explaining a method of manufacturing the wiring board according to the fourth embodiment of the invention.

Next, description will be given to a wiring board and a method of manufacturing the wiring board according to a fourth embodiment of the invention. FIG. 13 is a sectional view showing a wiring board 1D according to the fourth embodiment and FIG. 14 is a view for explaining a method of manufacturing the wiring board 1D.

A basic structure of the wiring board 1D according to the fourth embodiment is identical to that of the wiring board 1B according to the second embodiment described with reference to FIG. 8A. However, the wiring board 1D according to the embodiment is characterized in that a third reinforcing member 52 is provided on the side surface 30c of a wiring member 32. Also in the wiring board 1D in which a chip capacitor 70 is provided on the wiring member 32, thus, the third reinforcing member 52 can be provided on the side surface 30c so that a mechanical strength can be increased more greatly.

In each of the wiring boards 1B to 1D, the first reinforcing member 50 is formed on the whole surface in the opposed position to the back surface 30b. Consequently, a strength is increased in the opposed position to the opening portion 51X and the bonding position in which the fourth wiring layer 18c and the pin 40 are bonded to each other is reinforced in the same manner as the wiring board 1A according to the first embodiment.

Figure 15:
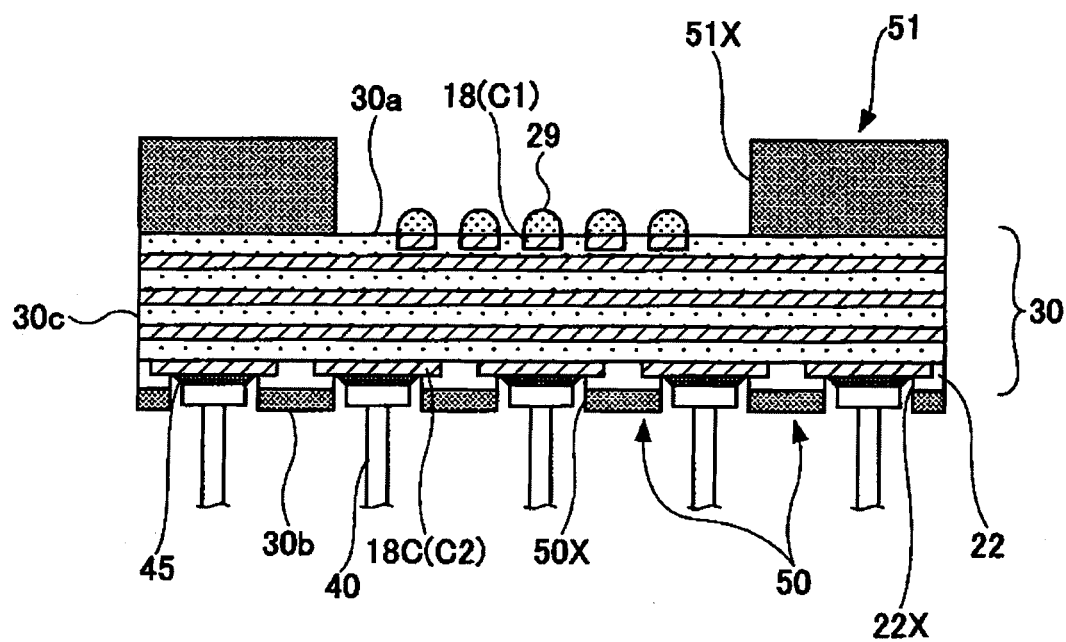
FIG. 15 is a sectional view showing a wiring board according to a fifth embodiment of the invention.

Next, description will be given to a wiring board and a method of manufacturing the wiring board according to a fifth embodiment of the invention. FIG. 15 is a sectional view showing a wiring board 1E according to the fifth embodiment, and FIGS. 16A to 17C are views for explaining a method of manufacturing the wiring board 1E.

The wiring boards 1A to 1D according to the first to fourth embodiments have the structure in which the first reinforcing member 50 is formed on the whole back surfaces 30b of the wiring members 30 and 32 and the bonding position of the fourth wiring layer 18c and the pin 40 is thus reinforced by the first reinforcing member 50. On the other hand, the wiring board 1E according to the embodiment is characterized in that a first reinforcing member 50 is formed on a whole surface except for a position in which a fourth wiring layer 18c is formed like a pad as a second connecting terminal over a back surface 30b of a wiring member 30.

More specifically, a solder resist 22 is formed on a back surface of the wiring member 30 and an opening portion 22X is formed in an opposed position to the fourth wiring layer 18c in the solder resist 22. Accordingly, the fourth wiring layer 18c is constituted to be exposed to an outside through the solder resist 22. The first reinforcing member 50 is formed over a whole surface of the solder resist 22 excluding the opening portion 22X. In the embodiment, consequently, the fourth wiring layer 18c is constituted to be exposed to the outside through the opening portion 22X and an opening portion 50X formed on the first reinforcing member 50.

In the case in which the first reinforcing member 50 constituted as described above is formed, it is not formed in the opening portion 50X and the opening portion 22X. Therefore, it is possible to dispose an external connecting terminal having an optional structure for the fourth wiring layer 18c.

In the wiring board 1E according to the fifth embodiment shown in FIG. 15, a pin 40 is bonded to the fourth wiring layer 18c to be a second connecting terminal by using a solder 45. On the other hand, in a wiring board 1F according to a sixth embodiment shown in FIGS. 16A and 16B, a ball-like terminal 41 formed by a solder ball is bonded to a fourth wiring layer 18c. By employing the structure in which a first reinforcing member 50 does not cover the fourth wiring layer 18c, thus, it is possible to increase a degree of freedom of a selection for an external connecting terminal to be connected to the fourth wiring layer 18c.

By employing the structure according to the embodiment, moreover, an opening portion 50X is necessarily formed on the first reinforcing member 50. However, a plurality of opening portions 50X having a small diameter is formed apart from each other differently from an opening portion 51X formed over a whole surface in a region in which a solder bump 29 is formed in the second reinforcing member 51. Therefore, the first reinforcing member 50 is formed over a whole back surface 30b except for a region in which the fourth wiring layer 18c (the opening portions 22X and 50X) is provided. Therefore, a function for enhancing a mechanical strength for a wiring member 30 is maintained. According to the wiring boards 1E and 1F in accordance with the embodiment, thus, it is possible to increase the strengths of the wiring boards 1E and 1F while enhancing a degree of freedom of a selection for an external connecting terminal.

In the wiring board 1E according to the fifth embodiment shown in FIG. 15, the pin 40 is provided on the fourth wiring layer 18c. In the wiring board 1F according to the sixth embodiment shown in FIG. 16A, moreover, the ball-shaped terminal 41 is provided on the fourth wiring layer 18c. However, the pin 40 and the ball-shaped terminal 41 do not need to be provided but the fourth wiring layer 18c can also be used directly as an external connecting terminal.

Next, description will be given to a method of manufacturing the wiring board 1E according to the fifth embodiment having the structure. Also in the embodiment, a process for manufacturing the wiring member 30 (the steps shown in FIGS. 3A to 5C) is the same as that of the first embodiment. In the following description, therefore, explanation will be given to only a step of molding first and second reinforcing members 50 and 51 with respect to the wiring member 30.

Figure 17A:
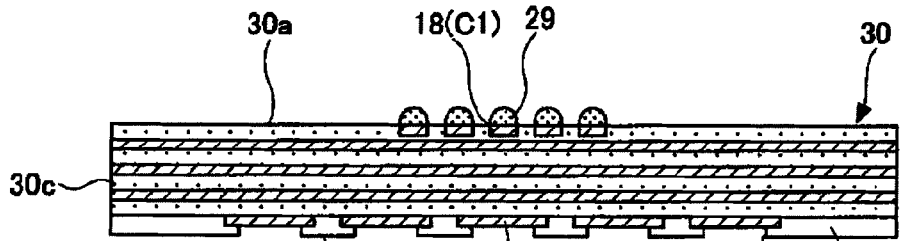
FIGS. 17A to 17C are sectional views (No. 1) for explaining a method of manufacturing the wiring board according to the fifth embodiment of the invention.

FIG. 17A shows the wiring member 30 to be used for the manufacturing method according to the embodiment. As shown in FIG. 17A, an external connecting terminal such as the pin 40 or the ball-shaped terminal 41 is not provided on the wiring member 30 but the fourth wiring layer 18c is exposed from an opening portion 22X formed on a solder resist 22.

As will be described below, the first reinforcing member 50 is formed on a surface on which the fourth wiring layer 18c is formed in the wiring member 30. The first reinforcing member 50 serves as the solder resist 22. Therefore, it is also possible to omit the provision of the solder resist 22.

Figure 17B:
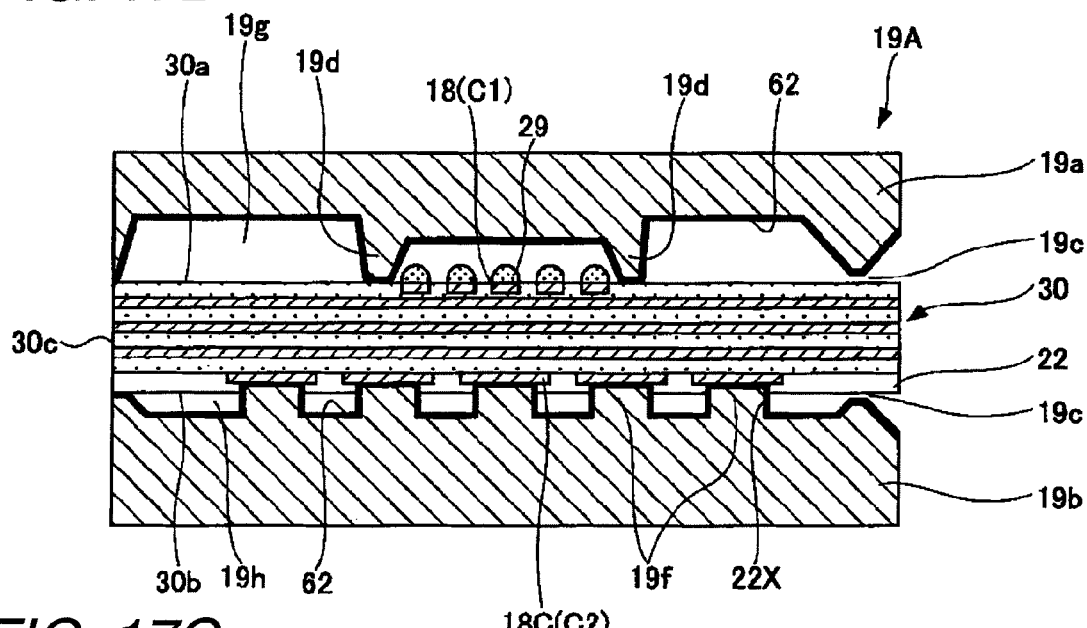

FIG. 17B shows a state in which the wiring member 30 is attached to the metal mold 19A. The metal mold 19A to be used in the embodiment is not provided with the pin inserting recess portion 19e differently from the metal mold 19A shown in FIG. 6B but a projecting portion 19f to abut on the fourth wiring layer 18c is formed. The projecting portion 19f functions to prevent a molding resin 60 to be injected from sticking to the fourth wiring layer 18c. The fourth wiring layer 18c is provided like a circular pad, for example.

Figure 17C:
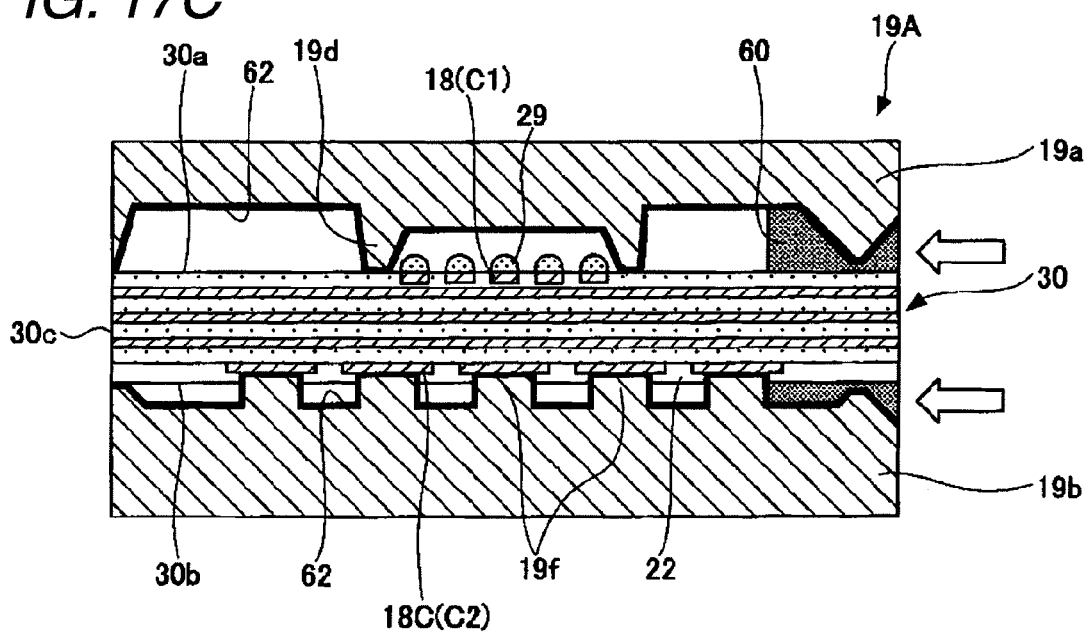
Figure 18A:
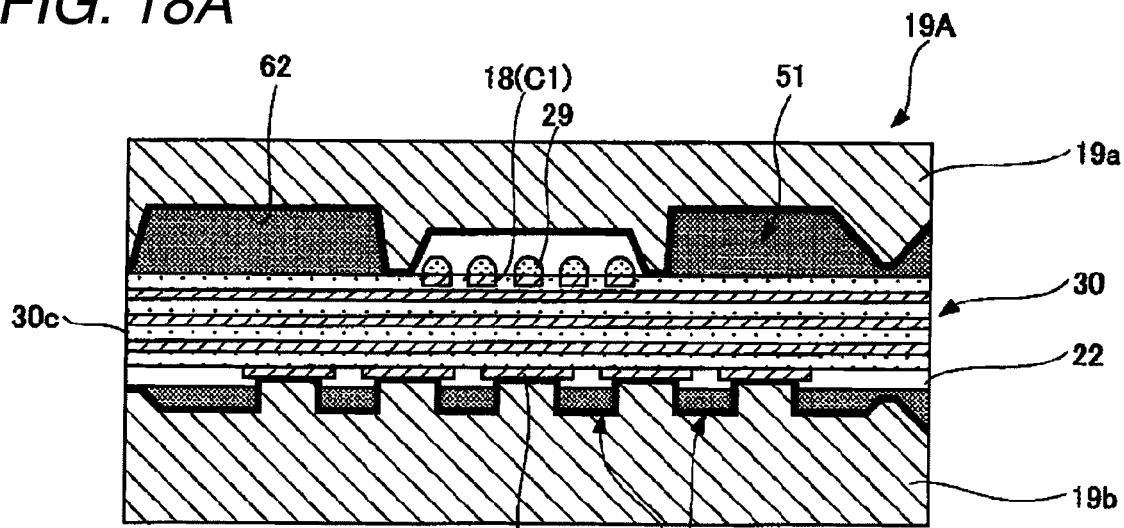
FIGS. 18A to 18C are sectional views (No. 2) for explaining the method of manufacturing the wiring board according to the fifth embodiment of the invention.

When the wiring member 30 is attached to the metal mold 19A, thus, the molding resin 60 is injected from a resin injecting port 19c into the metal mold 19A as shown in FIG. 17C. As shown in FIG. 18A, consequently, the second reinforcing member 51 is formed on a surface 30a of the wiring member 30 and the first reinforcing member 50 is formed except for a position in which the fourth wiring layer 18c is formed in the back surface 30b.

Figure 16A:
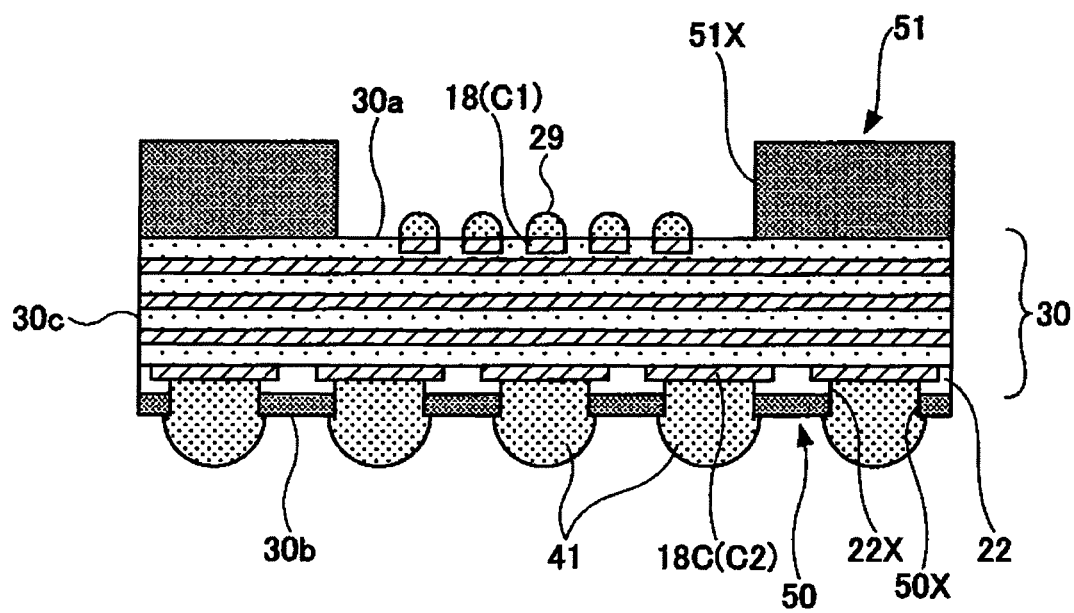
FIGS. 16A and 16B are sectional and bottom views showing a wiring board according to a sixth embodiment of the invention.
Figure 16B:
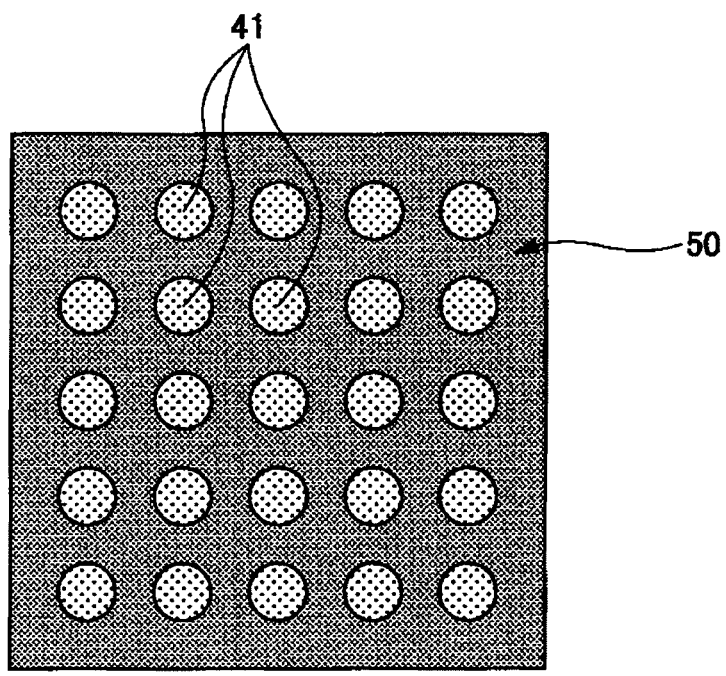
Figure 18B:
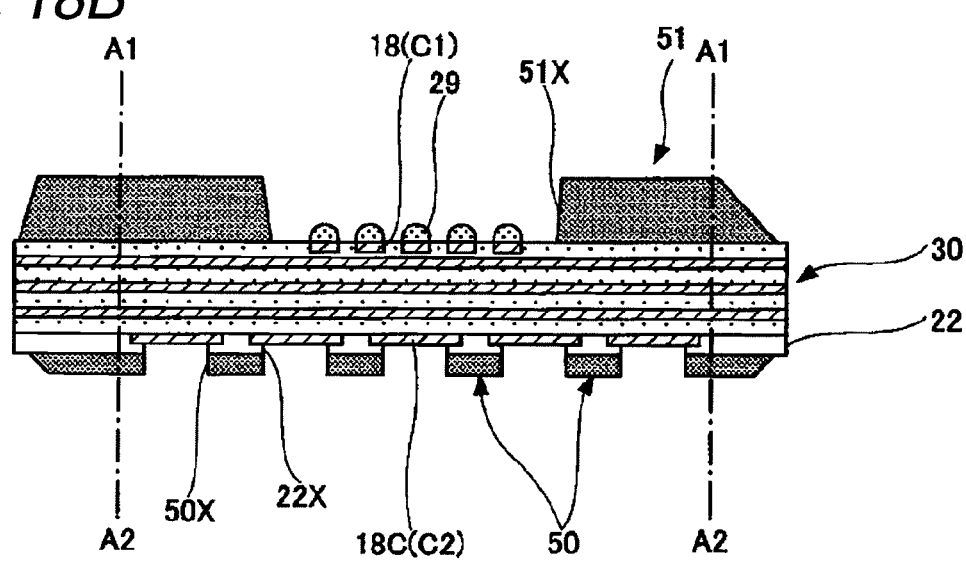
Figure 18C:
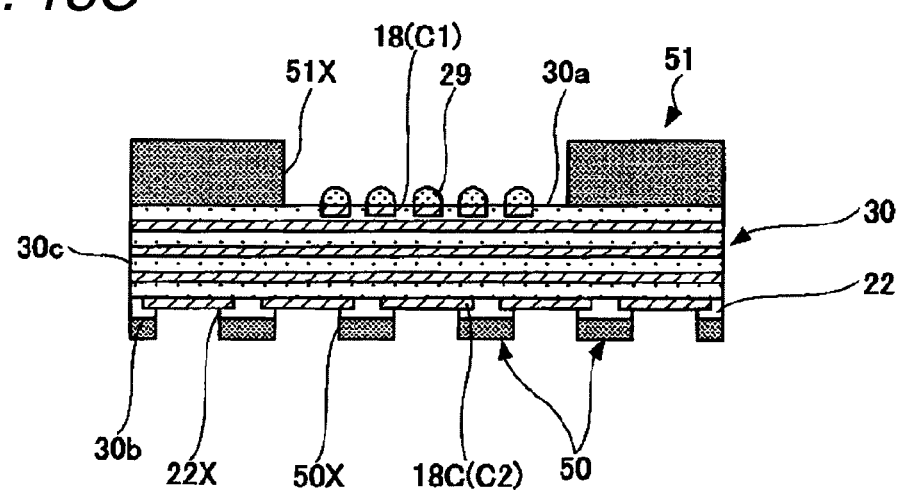

As shown in FIG. 18B, subsequently, the wiring member 30 provided with the first and second reinforcing members 50 and 51 is taken out of the metal mold 19A, and a cut processing is carried out in a predetermined cutting position (shown in A1-A2 in the drawing) corresponding to a shape of the wiring board 1E. Consequently, a wiring board is manufactured as shown in FIG. 18C. The pin 40 is provided on the wiring board so that the wiring board 1E shown in FIG. 15 is manufactured. Moreover, the ball-shaped terminal 41 is provided so that the wiring board 1F shown in FIG. 16A is manufactured.

Figure 19:
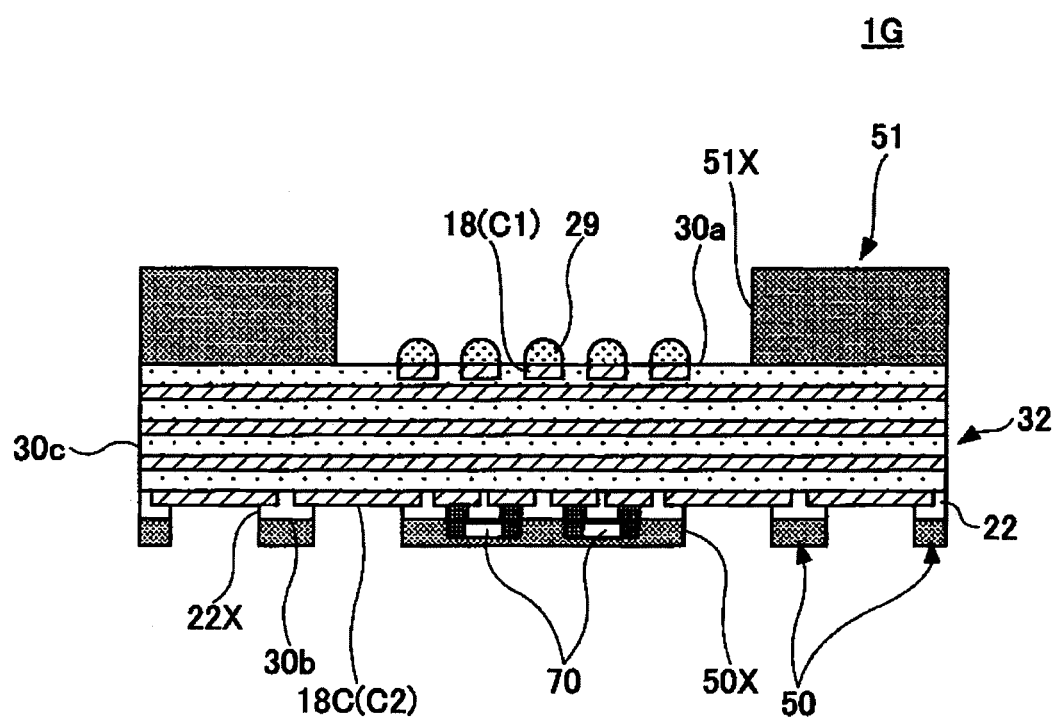
FIG. 19 is a sectional view showing a wiring board according to a seventh embodiment of the invention.

Next, description will be given to a wiring board and a method of manufacturing the wiring board according to a seventh embodiment of the invention. FIG. 19 is a sectional view showing a wiring board 1G according to the seventh embodiment and FIG. 20 is a view for explaining a method of manufacturing the wiring board 1G.

A basic structure of the wiring board 1G according to the seventh embodiment is almost identical to that of each of the wiring boards 1E and 1F according to the fifth and sixth embodiments described with reference to FIGS. 15 to 18C. However, the wiring board 1G according to the embodiment is characterized in that a chip capacitor 70 (an electronic component) is provided on a back surface 30b of a wiring member 32 and is sealed with a first reinforcing member 50.

The chip capacitor 70 is bonded to the fourth wiring layer 18c by using the solder 45. Also in the embodiment, moreover, the first reinforcing member 50 is molded over the whole back surface 30b of the wiring member 32 except for a position in which the fourth wiring layer 18c is formed. In the molding state, the chip capacitor 70 is buried in the first reinforcing member 50. Accordingly to the embodiment, therefore, an insulating property from the chip capacitor 70 can be enhanced so that a reliability of a so-called chip integrated board can be increased.

Figure 20:
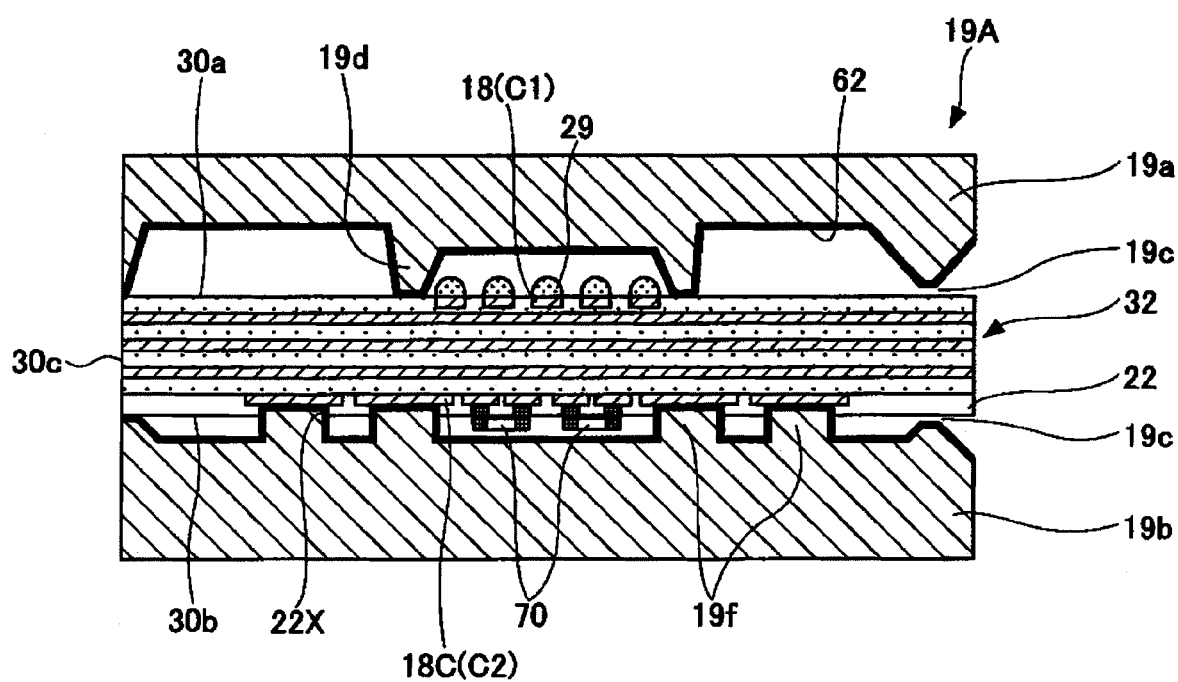
FIG. 20 is a sectional view for explaining a method of manufacturing the wiring board according to the seventh embodiment of the invention.

In order to manufacture the wiring board 1G according to the seventh embodiment having the structure, as shown in FIG. 20, the wiring member 32 having the chip capacitor 70 provided thereon is attached to a metal mold 19A. In this state, the chip capacitor 70 is positioned in a cavity 19h on a lower side and a gap is formed between an internal wall of the cavity 19h and the capacitor 70. Furthermore, a projecting portion 19f formed on a lower mold 19b is set into an abutting state on the fourth wiring layer 18c of the wiring member 30.

When the wiring member 32 is attached to the metal mold 19A, thus, processings in FIGS. 17C, 18A and 18B are executed so that the wiring board 1G shown in FIG. 19 is manufactured. Even if the chip capacitor 70 is provided on the wiring member 32, thus, the wiring board 1G can be manufactured by the same molding method as that in the fifth and sixth embodiments.

Figure 21:
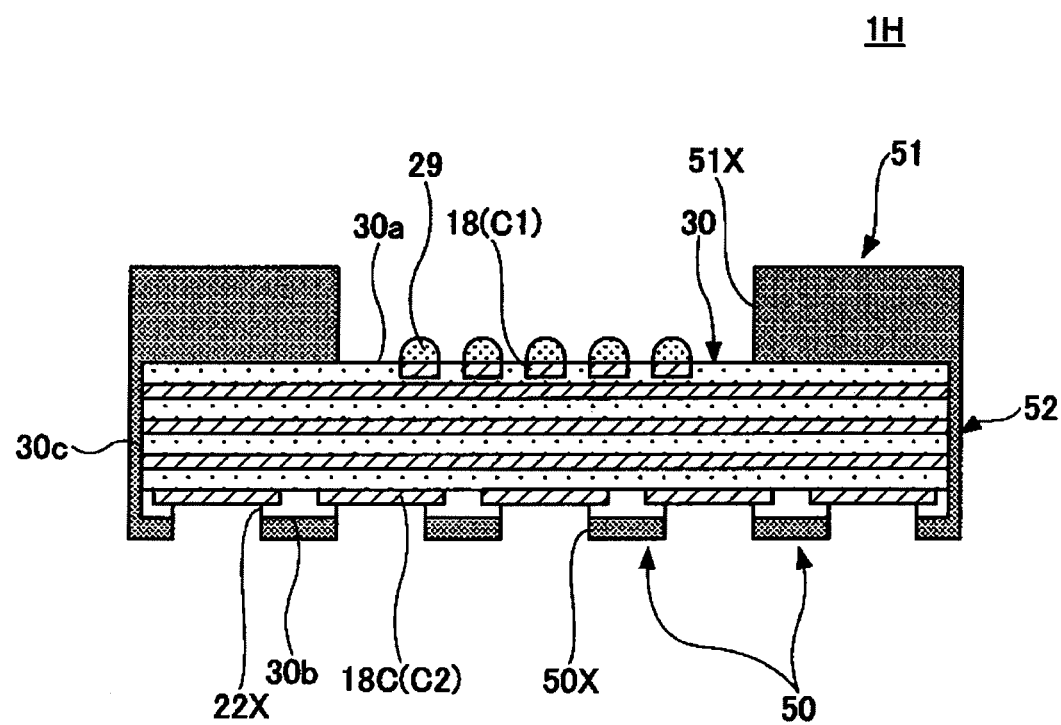
FIG. 21 is a sectional view showing a wiring board according to an eighth embodiment of the invention.

Next, description will be given to a wiring board and a method of manufacturing the wiring board according to an eighth embodiment of the invention. FIG. 21 is a sectional view showing a wiring board 1H according to the eighth embodiment and FIGS. 22A to 23B are views for explaining a method of manufacturing the wiring board 1H.

The wiring board 1H according to the eighth embodiment also has a basic structure which is almost identical to that of each of the wiring boards 1E and 1F according to the fifth and sixth embodiments described with reference to FIGS. 15 to 18C. However, the wiring board 1H according to the embodiment is characterized in that a third reinforcing member 52 is provided in an opposed position to a side surface 30c of the wiring member 30. Consequently, the wiring member 30 is brought into a state in which it is sealed with first to third reinforcing members 50 to 52 except for opposed regions to opening portions 50X and 51X. Consequently, it is possible to enhance a mechanical reinforcement of the wiring board 1H more greatly.

Next, description will be given to a method of manufacturing the wiring board 1H according to the eighth embodiment having the structure. A process for manufacturing the wiring member 30 (the steps shown in FIGS. 3A to 5C) is the same as that in the first embodiment. Also in the description of the embodiment, therefore, explanation will be given to only a step of molding the first to third reinforcing members 50 to 52 with respect to the wiring member 30.

Figure 22A:
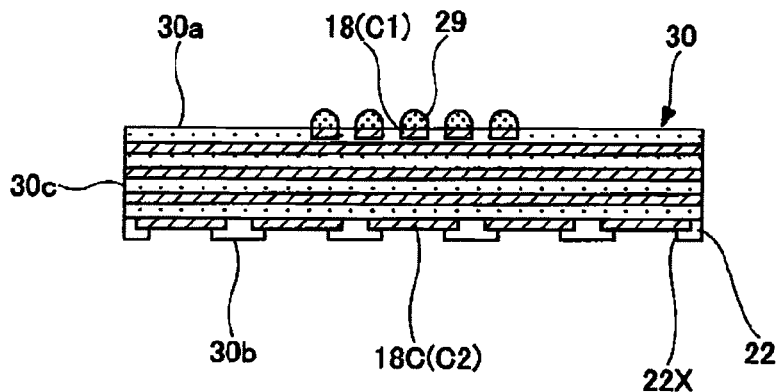
FIGS. 22A to 22C are sectional views (No. 1) for explaining a method of manufacturing the wiring board according to the eighth embodiment of the invention.

FIG. 22A shows the wiring member 30 to be used in the manufacturing method according to the embodiment. As shown in FIG. 22A, the wiring member 30 is not provided with an external connecting terminal such as a pin 40 or a ball-shaped terminal 41, and the fourth wiring layer 18c is exposed from an opening portion 22X formed on a solder resist 22.

Figure 22B:
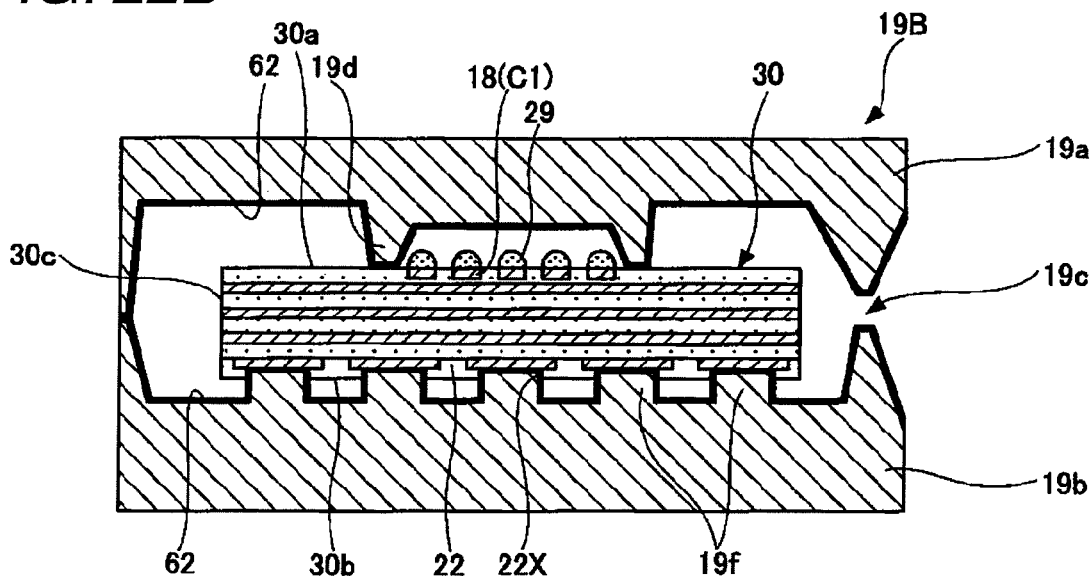

FIG. 22B shows a state in which the wiring member 30 is attached to a metal mold 19B. The metal mold 19B to be used in the embodiment is constituted to perfectly accommodate the wiring member 30 in cavities 19g and 19h differently from the metal mold 19A shown in FIG. 17B. More specifically, in the embodiment, a side surface 30c of the wiring member 30 is not exposed to an outside of the metal mold 19B in a state in which the wiring member 30 is attached to the metal mold 19B.

Figure 22C:
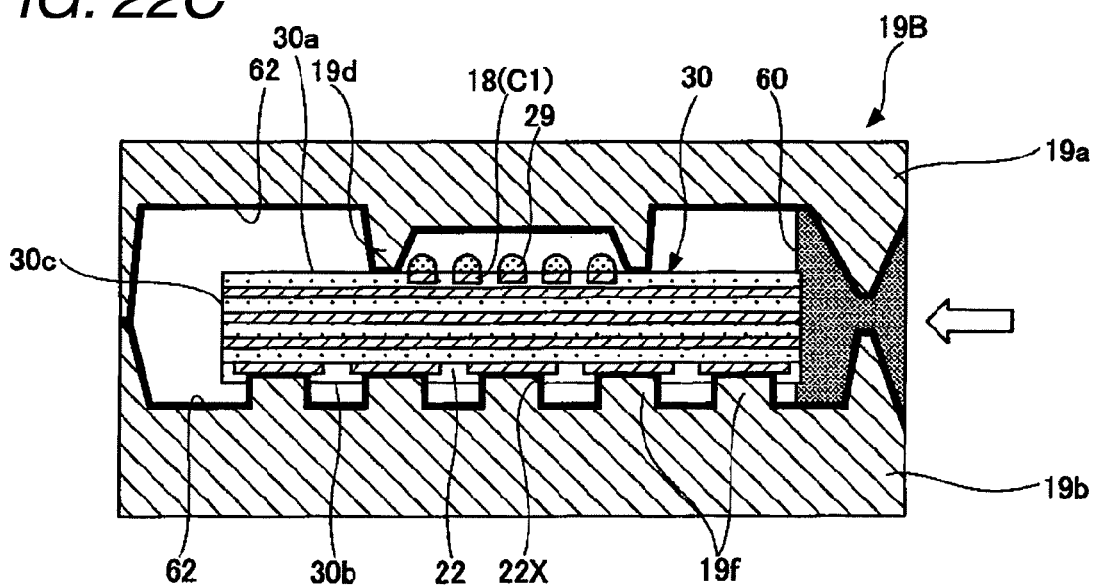
Figure 23A:
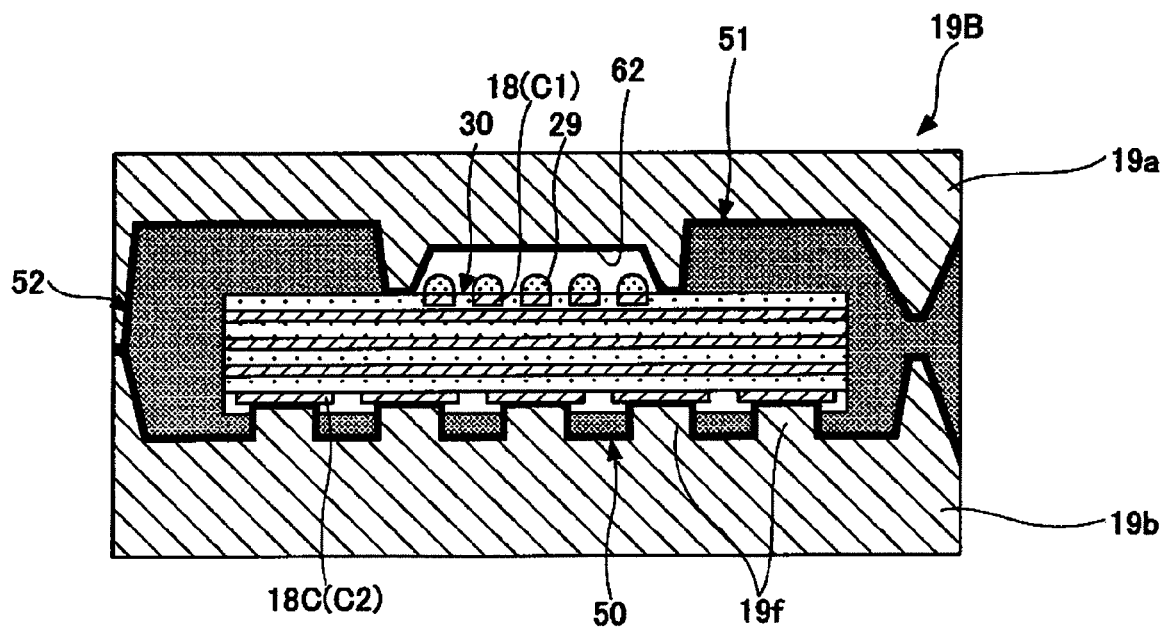
FIGS. 23A and 23B are sectional views (No. 2) for explaining the method of manufacturing the wiring board according to the eighth embodiment of the invention.
Figure 23B:
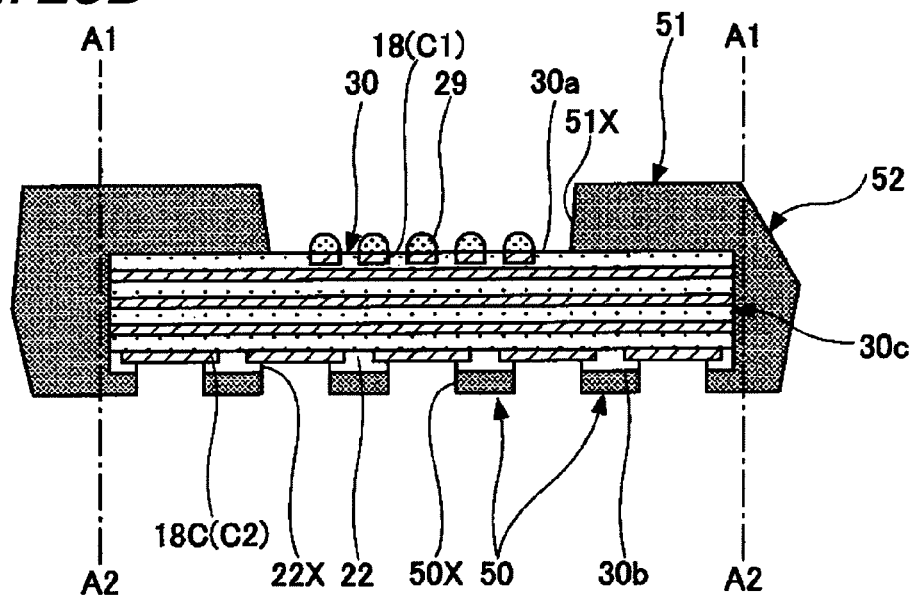

When the wiring member 30 is attached to the metal mold 19B, thus, a molding resin 60 is injected from a resin injecting port 19c into the metal mold 19B as shown in FIG. 22C. As shown in FIG. 23A, consequently, a second reinforcing member 51 is formed in an opposed position to a surface 30a of the wiring member 30 and a first reinforcing member 50 is formed in an opposed position to a back surface 30b, and furthermore, a third reinforcing member 52 is formed in an opposed position to the side surface 30c. As shown in FIG. 23B, subsequently, the wiring member 30 having the reinforcing members 50, 51 and 52 formed thereon is taken out of the metal mold 19B and a cut processing is carried out in a predetermined cutting position (shown in A1-A2 in the drawing) corresponding to a shape of the wiring board 1H. Consequently, the wiring board 1H is manufactured.

Figure 24:
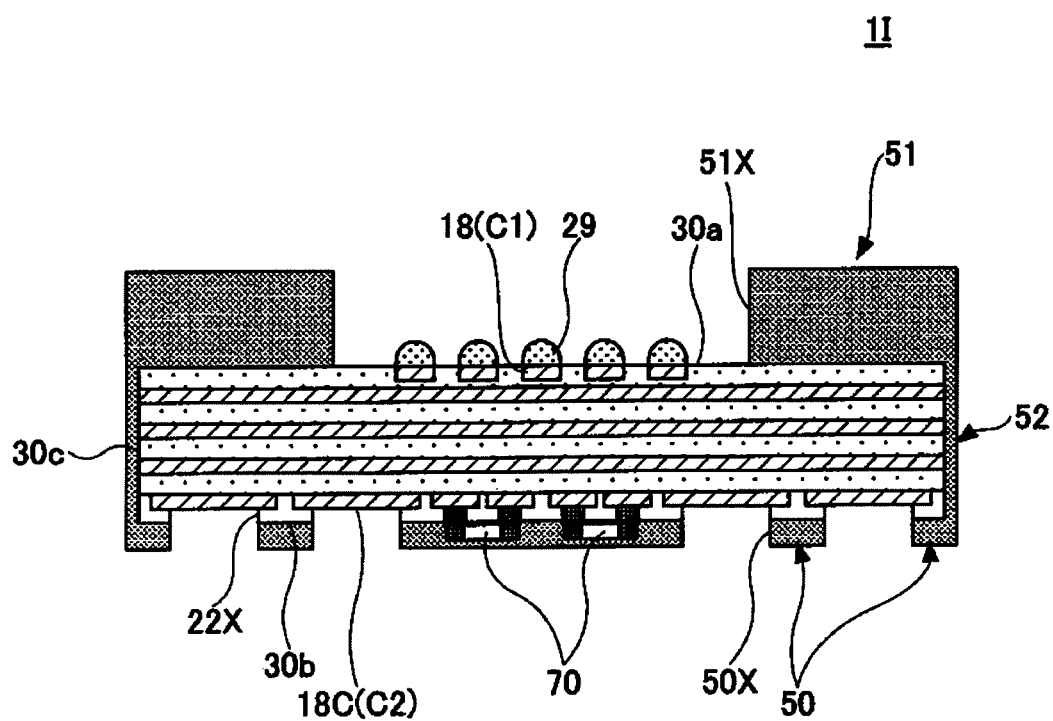
FIG. 24 is a sectional view showing a wiring board according to a ninth embodiment of the invention.
Figure 25:
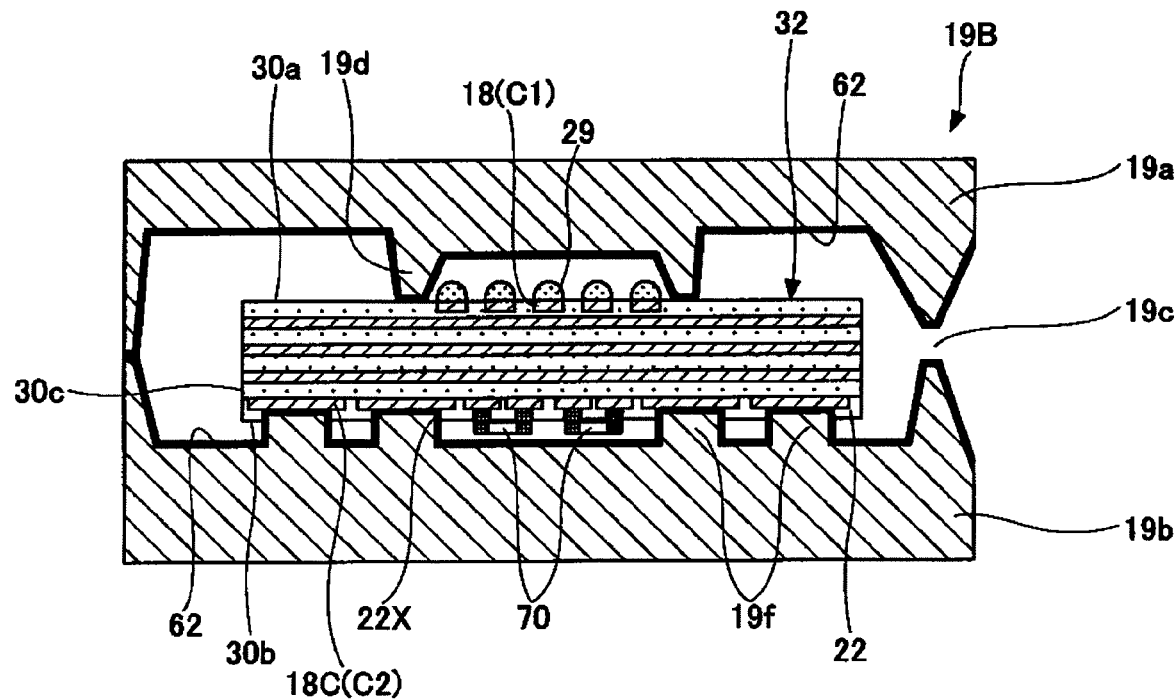
FIG. 25 is a sectional view for explaining a method of manufacturing the wiring board according to the ninth embodiment of the invention.

Next, description will be given to a wiring board and a method of manufacturing the wiring board according to a ninth embodiment of the invention. FIG. 24 is a sectional view showing a wiring board 1I according to the ninth embodiment and FIG. 25 is a view for explaining a method of manufacturing the wiring board 1I.

A basic structure of the wiring board 1I according to the ninth embodiment is identical to that of the wiring board 1G according to the seventh embodiment described with reference to FIG. 19. However, the wiring board 1I according to the embodiment is characterized in that a third reinforcing member 52 is provided on the side surface 30c of a wiring member 32. Also in the wiring board 1I in which a chip capacitor 70 is provided on the wiring member 32, thus, the third reinforcing member 52 can be provided on the side surface 30c so that a mechanical strength can be increased more greatly.

Each of the wiring boards 1G to 1I does not have a first reinforcing member 50 formed in an opposed position to the fourth wiring layer 18c in the back surface 30b of the wiring member 30 but has a degree of freedom of a selection for an external connecting terminal (a pin 40 or a ball-shaped terminal 41) in the same manner as the wiring boards 1E and 1F according to the fifth and sixth embodiments.

Figure 26:
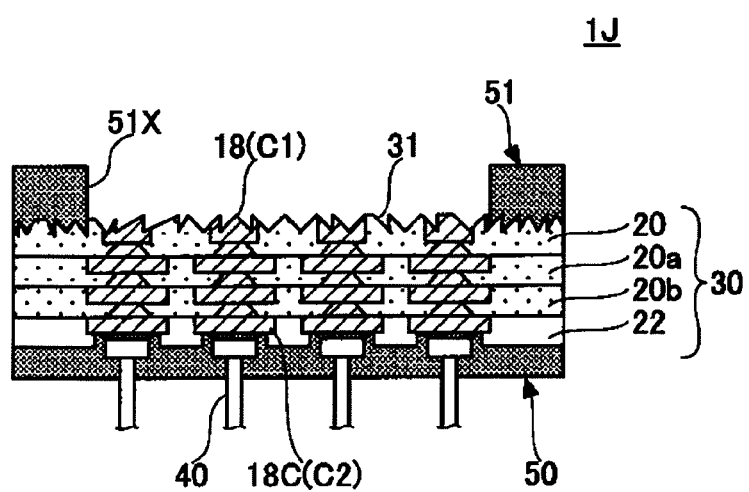
FIG. 26 is a sectional view showing a wiring board according to a tenth embodiment of the invention.

Next, description will be given to a wiring board and a method of manufacturing the wiring board according to a tenth embodiment of the invention. FIG. 26 is a sectional view showing a wiring board 1J according to the tenth embodiment and FIG. 27 is a view for explaining a method of manufacturing the wiring board 1J.

A basic structure of the wiring board 1J according to the tenth embodiment is identical to that of the wiring board 1A according to the first embodiment described with reference to FIG. 2. However, the wiring board 1J according to the embodiment is characterized in that a roughened surface 31 is formed on an upper surface of a wiring member 30. The roughened surface 31 is provided in contact with a support 10 in a manufacturing process which will be described below and is formed on a surface of the wiring member 30 on a side where an electronic element 12 is provided in the embodiment.

By forming the roughened surface 31 on the wiring member 30, thus, it is possible to enhance an adhesion of the wiring member 30 and a second reinforcing member 51. Thus, it is possible to improve a reliability of the wiring board 1J.

Figure 27A:
FIGS. 27A to 27E are sectional views for explaining a method of manufacturing the wiring board according to the tenth embodiment of the invention.
Figure 27B:

In order to manufacture the wiring board 1J having the structure, a roughening treatment is carried out over a surface of the support 10 shown in FIG. 27A. For the roughening treatment method, it is possible to use wet etching or sand blasting, for example. FIG. 27B shows the support 10 in which a roughened surface 10a is formed.

Figure 27C:
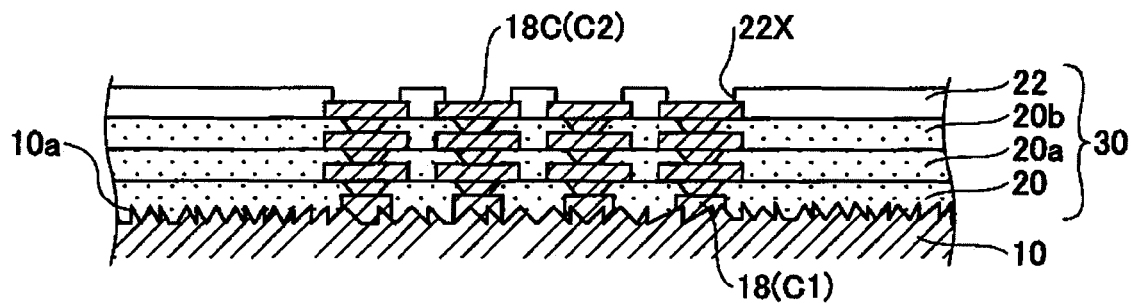

Subsequently, the wiring member 30 is formed on the roughened surface 10a of the support 10 by the same manufacturing method as described above. FIG. 27C shows a state in which the wiring member 30 is formed on the roughened surface 10a.

Figure 27D:
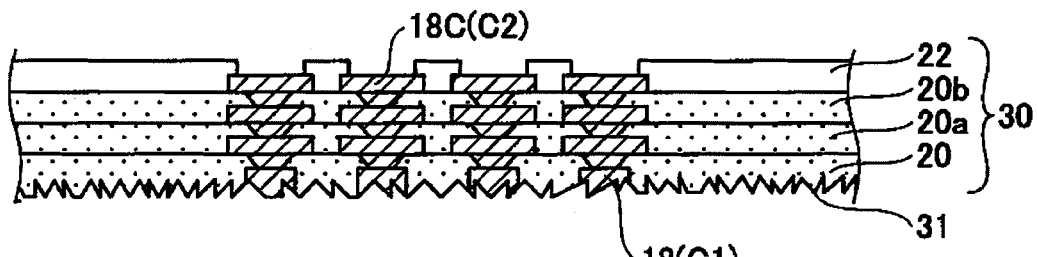

When the wiring member 30 is formed on the support 10, the support 10 is removed by etching. FIG. 27D shows the wiring member 30 in a state in which the support 10 is removed. As shown in FIG. 27D, the roughened surface 10a formed on the support 10 is transferred onto the wiring member 30. Accordingly, the roughened surface 31 is formed on a surface of the wiring member 30 which is provided in contact with the support 10.

Next, a pin 40 is provided on a fourth wiring layer 18c, and furthermore, the wiring member 30 having the roughened surface 31 formed thereon is attached to a metal mold 19A to carry out a processing for molding first and second reinforcing members 50 and 51 in the same manner as described with reference to FIGS. 6A to 7C.

Figure 27E:
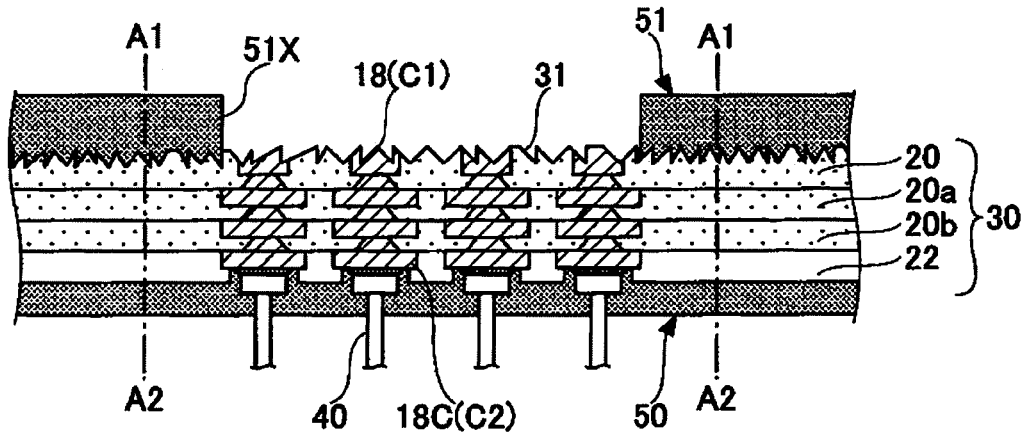

FIG. 27E shows a state in which the wiring member 30 having the first and second reinforcing members 50 and 51 molded thereon is released from the metal mold 19A. As shown in FIG. 27E, the second reinforcing member 51 is molded on the roughened surface 31. Therefore, the second reinforcing member 51 is brought to cut into recesses and projecting portions of the roughened surface 31.

For this reason, the second reinforcing member 51 is firmly fixed to the wiring member 30. Accordingly, the second reinforcing member 51 is prevented from being peeled from the wiring member 30. Therefore, it is possible to enhance a reliability of the wiring board 1J. Subsequently, the wiring member 30 having the first and second reinforcing members 50 and 51 provided thereon is cut through an A1-A2 line shown in FIG. 27E. Consequently, the wiring board 1J shown in FIG. 26 is manufactured.

Figure 28:
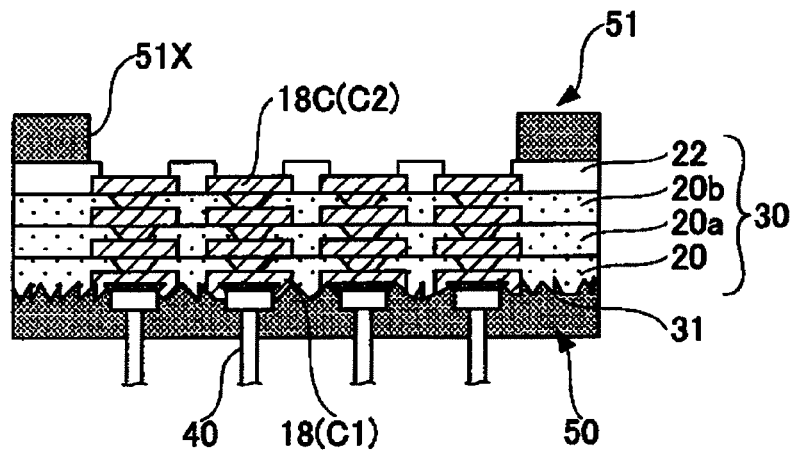
FIG. 28 is a sectional view showing a wiring board according to an eleventh embodiment of the invention.

Next, description will be given to a wiring board and a method of manufacturing the wiring board according to an eleventh embodiment of the invention. FIG. 28 is a sectional view showing a wiring board 1K according to the eleventh embodiment and FIG. 29 is a view for explaining a method of manufacturing the wiring board 1K.

A basic structure of the wiring board 1K according to the eleventh embodiment is identical to that of the wiring board 1J according to the tenth embodiment described with reference to FIG. 26. In the wiring board 1J according to the tenth embodiment, however, the surface (roughened surface 31) provided in contact with the support 10 in the manufacturing process is set to be a mounting surface of the electronic element 12 and a surface on an opposite side acts as an external connecting surface. On the other hand, the wiring board 1K according to the embodiment is characterized in that a surface (roughened surface 31) provided in contact with the support 10 in a manufacturing process is set to be an external connecting surface and a surface on an opposite side is set to be a mounting surface of an electronic element 12.

The wiring board 1K according to the embodiment has a structure in which the first reinforcing member 50 is molded on the roughened surface 31, and the first reinforcing member 50 is maintained to cut into recesses and projecting portions of the roughened surface 31. For this reason, the first reinforcing member 50 is firmly fixed to the wiring member 30. Accordingly, the first reinforcing member 50 is prevented from being peeled from the wiring member 30. Therefore, it is possible to enhance a reliability of the wiring board 1K.

Figure 29A:
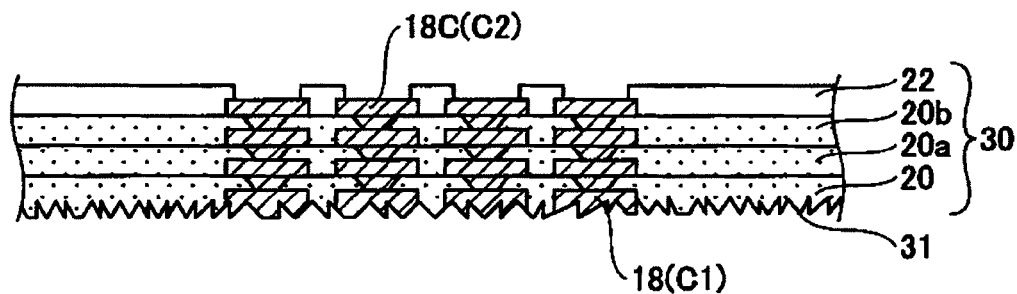
FIGS. 29A and 29B are sectional views for explaining a method of manufacturing the wiring board according to the eleventh embodiment of the invention.

A process for manufacturing the wiring board 1K having the structure is basically identical to the manufacturing method according to the tenth embodiment shown in FIGS. 27A to 27D. More specifically, the steps shown in FIGS. 27A to 27D are identical to those of the manufacturing method according to the embodiment. FIG. 29A is an equivalent view to the wiring member 30 shown in FIG. 27D and a view showing a state in which the support 10 is removed.

Figure 29B:
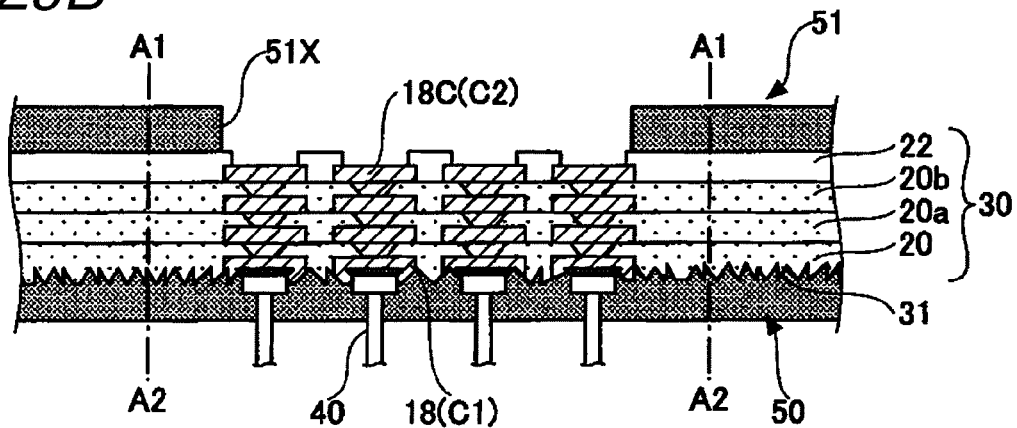

In the embodiment, a pin 40 is disposed on a connecting pad 18 provided on the roughened surface 31 side to be the surface from which the support 10 is removed, and furthermore, the wiring member 30 is attached to a metal mold 19A to carry out a processing for molding the first and second reinforcing members 50 and 51. FIG. 29B shows a state in which the reinforcing member is formed on a roughened surface 10a.

As shown in FIG. 29B, the first reinforcing member 50 is molded on the roughened surface 31. Therefore, the first reinforcing member 50 is maintained to cut into the recesses and projecting portions of the roughened surface 31. For this reason, the first reinforcing member 50 is firmly fixed to the wiring member 30. Accordingly, the first reinforcing member 50 is prevented from being peeled from the wiring member 30. Therefore, it is possible to enhance the reliability of the wiring board 1K.

Subsequently, the wiring member 30 having the first and second reinforcing members 50 and 51 provided thereon is cut through an A1-A2 line shown in FIG. 29B. Consequently, the wiring board 1K shown in FIG. 28 is manufactured.

While the preferred embodiments according to the invention have been described above in detail, the invention is not restricted to the specific embodiments but various changes and modifications can be carried out without departing from the gist of the invention described in the claims.

For example, there has been described the structure in which the chip capacitor 70 is disposed on only the back surface 30b side of the wiring member 32 and is sealed with the first reinforcing member 50 in the wiring boards 1D, 1G and 1I shown in FIGS. 13, 19 and 24, it is also possible to employ a structure in which the chip capacitor 70 is disposed on the surface 30a side of the wiring member 32 and is sealed with the second reinforcing member 51 in the same manner as in the wiring board 1B shown in FIG. 8A.

In each of the first to tenth embodiments, moreover, the surface provided in contact with the support 10 serves as the surface on which the electronic element 12 is provided and the surface on the opposite side thereof is externally connected in the process for manufacturing each of the wiring boards 1A to 1J. As in the eleventh embodiment, however, it is also possible to set, as the externally connected surface, the surface provided in contact with the support 10 and to set the surface on the opposite side thereof as the surface on which the electronic element 12 is provided in the process for manufacturing each of the wiring boards 1A to 1J.

Although the structure in which the roughened surface 31 is formed on the wiring member 30 has been described in the eleventh embodiment, moreover, it is also possible to form the roughened surface 31 on the wiring members 30 and 32 according to the first to tenth embodiments. Consequently, it is possible to enhance the adhesion and bonding property of the reinforcing members 50 and 51 and the wiring members 30 and 32.

In the fifth to ninth embodiments, furthermore, the pad-shaped fourth wiring layer 18c has such a structure that a peripheral edge portion is covered with the solder resist 22 or the first reinforcing member 50. However, it is also possible to employ a structure in which the whole pad-shaped fourth wiring layer 18c is exposed into the opening portion 22X of the solder resist 22 or the opening portion 50X of the first reinforcing member 50.

What is claimed is:
1. A wiring board comprising:
a wiring member formed of alternatingly stacked wiring layers and insulating layers, the wiring layers including a first connection pad formed on a first surface of the wiring member and a second connection pad formed on a second surface of the wiring member, the second surface of the wiring member being a surface opposite to the first surface of the wiring member;
a solder resist layer formed on the second surface of the wiring member and having a first opening portion so that the second connection pad is not covered by the solder resist layer, the solder resist layer being formed on an outermost surface layer of the wiring member;
an external connecting terminal formed on the second connection pad;
a first reinforcing member formed on the solder resist layer, the first reinforcing member including a filler material and covering the first opening portion of the solder resist layer, the first reinforcing member forming a first outermost layer of the wiring board; and
a second reinforcing member formed on the first surface of the wiring member and having a second opening portion extending through the second reinforcing member at a central part of the second reinforcing member, the second reinforcing member forming a second outermost layer of the wiring board, the second opening portion exposing the first connection pad, wherein the first and the second reinforcing members are configured to reinforce the wiring board.

2. A wiring board comprising:
a wiring member formed of alternatingly stacked wiring layers and insulating layers, the wiring layers including a first connection pad formed on a first surface of the wiring member and a second connection pad formed on a second surface of the wiring member, the second surface of the wiring member being a surface opposite to the first surface of the wiring member;
a solder resist layer formed on the second surface of the wiring member and having a first opening portion so that the second connection pad is not covered by the solder resist layer, the solder resist layer being formed on an outermost surface layer of the wiring member;
an external connecting terminal formed on the second connection pad;
a first reinforcing member formed on the solder resist layer, the first reinforcing member including a filler material, the first reinforcing member forming a first outermost layer of the wiring board and having a second opening portion; and
a second reinforcing member formed on the first surface of the wiring member and having a third opening portion extending through the second reinforcing member at a central part of the second reinforcing member, the second reinforcing member forming a second outermost layer of the wiring board, the third opening portion exposing the first connection pad; wherein the first opening portion in the solder resist layer is coincident with the second opening portion in the first reinforcing member and wherein the first and the second reinforcing members are configured to reinforce the wiring board.

3. The wiring board according to claim 1, wherein the first surface of the wiring member or the second surface of the wiring member is a roughened surface.

4. The wiring board according to claim 1, further comprising:
an electronic component provided on the second surface of the wiring member,
wherein the electronic component is sealed with the first reinforcing member.

5. The wiring board according to claim 1, further comprising:
a third reinforcing member formed on a side surface of the wiring member.

6. The wiring board according to claim 2, wherein the first surface of the wiring member or the second surface of the wiring member is a roughened surface.

7. The wiring board according to claim 2, further comprising:
an electronic component provided on the second surface of the wiring member,
wherein the electronic component is sealed with the first reinforcing member.

8. The wiring board according to claim 2, further comprising:
a third reinforcing member formed on a side surface of the wiring member.

9. The wiring board according to claim 1, wherein the filler makes up 85% to 90% weight percent of the first reinforcing member.

10. The wiring board according to claim 2, wherein the filler makes up 85% to 90% weight percent of the first reinforcing member.

11. The wiring board according to claim 1, further comprising:
an electronic component provided in the second opening portion,
wherein an upper surface of the second reinforcing member and an upper surface of the electronic component are at a same level.

12. The wiring board according to claim 2, further comprising:
an electronic component provided in the third opening portion,
wherein an upper surface of the second reinforcing member and an upper surface of the electronic component are at a same level.

* * * * *